US010844487B2

(12) United States Patent
Takahashi et al.

(10) Patent No.: US 10,844,487 B2
(45) Date of Patent: *Nov. 24, 2020

(54) FILM DEPOSITION METHOD AND FILM DEPOSITION APPARATUS

(71) Applicant: Tokyo Electron Limited, Tokyo (JP)

(72) Inventors: Yutaka Takahashi, Iwate (JP); Masahiro Murata, Iwate (JP); Hitoshi Kato, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 47 days.

This patent is subject to a terminal disclaimer.

(21) Appl. No.: 15/901,100

(22) Filed: Feb. 21, 2018

(65) Prior Publication Data

US 2018/0237912 A1 Aug. 23, 2018

(30) Foreign Application Priority Data

Feb. 22, 2017 (JP) .................................. 2017-031528

(51) Int. Cl.
*C23C 16/455* (2006.01)
*C23C 16/34* (2006.01)
(Continued)

(52) U.S. Cl.
CPC ........ *C23C 16/45536* (2013.01); *C23C 16/02* (2013.01); *C23C 16/0272* (2013.01);
(Continued)

(58) Field of Classification Search
CPC ... C23C 16/02; C23C 16/0272; C23C 16/045; C23C 16/047; C23C 16/34;
(Continued)

(56) References Cited

U.S. PATENT DOCUMENTS

| 5,178,682 A | 1/1993 | Tsukamoto et al. |
| 7,504,681 B2 | 3/2009 | Lim |

(Continued)

FOREIGN PATENT DOCUMENTS

| JP | 2000-174007 | 6/2000 |
| JP | 2004-281853 | 10/2004 |

(Continued)

OTHER PUBLICATIONS

Oh et al. "Accurate Measurement of Atomic Chlorine Radical Density in Process Plasma with Spatially Resolvable Optical Emission Spectrometer" (2015). International Journal of Precision engineering and Manufacturing vol. 16, No. 8. pp. 1919-1924 (Year: 2015).*

*Primary Examiner* — Jose I Hernandez-Kenney
(74) *Attorney, Agent, or Firm* — IPUSA, PLLC

(57) ABSTRACT

A film deposition method is provided for filling a recessed pattern formed in a surface of a substrate with a film. In the method, an adsorption blocking group is formed by adsorbing chlorine gas activated by plasma on a top surface of the substrate and an upper portion of the recessed pattern. A source gas that contains one of silicon and a metal, and chlorine, is adsorbed on a lower portion of the recessed pattern where the adsorption blocking group is not formed, by supplying the source gas to the surface of the substrate including the recessed pattern. A molecular layer of a nitride film produced by a reaction of the source gas and a nitriding gas is deposited on the lower portion of the trench by supplying the nitriding gas to the surface of the substrate including the recessed pattern.

13 Claims, 20 Drawing Sheets

(51) Int. Cl.
  *C23C 16/02* (2006.01)
  *C23C 16/04* (2006.01)
  *H01J 37/32* (2006.01)

(52) U.S. Cl.
  CPC .......... *C23C 16/045* (2013.01); *C23C 16/345* (2013.01); *C23C 16/45544* (2013.01); *C23C 16/45551* (2013.01); *H01J 37/321* (2013.01); *H01J 37/32357* (2013.01); *H01J 37/32366* (2013.01); *H01J 37/32458* (2013.01); *H01J 37/32513* (2013.01); *H01J 37/32651* (2013.01); *H01J 37/32715* (2013.01); *H01J 37/32752* (2013.01); *H01J 37/32899* (2013.01)

(58) Field of Classification Search
  CPC ............ C23C 16/345; C23C 16/45536; C23C 16/45544; C23C 16/45551; H01J 37/321; H01J 37/32357; H01J 37/32366; H01J 37/32458; H01J 37/32513; H01J 37/32651; H01J 37/32715; H01J 37/32752; H01J 37/32899
  See application file for complete search history.

(56) References Cited

U.S. PATENT DOCUMENTS

| | | |
|---|---|---|
| 8,900,963 B2 | 12/2014 | Sills et al. |
| 8,956,984 B2 | 2/2015 | Okuda |
| 9,177,786 B2 | 11/2015 | Sano et al. |
| 9,865,457 B2 | 1/2018 | Hasebe et al. |
| 10,026,606 B2* | 7/2018 | Kato ................. C23C 16/45551 |
| 10,312,078 B2 | 6/2019 | Murakami et al. |
| 2006/0199399 A1 | 9/2006 | Muscat |
| 2007/0269982 A1* | 11/2007 | Rocklein ............... C23C 16/405 438/680 |
| 2008/0242097 A1 | 10/2008 | Boescke et al. |
| 2012/0052693 A1* | 3/2012 | Ozaki .................. C23C 16/402 438/771 |
| 2013/0171822 A1* | 7/2013 | Chandrashekar ........................... H01L 21/28556 438/675 |
| 2014/0051263 A1 | 2/2014 | Tanaka et al. |
| 2014/0199854 A1 | 7/2014 | Chen et al. |
| 2014/0209562 A1* | 7/2014 | LaVoie ............. H01L 21/02274 216/2 |
| 2014/0213037 A1* | 7/2014 | LiCausi ........... H01L 21/76224 438/429 |
| 2015/0099374 A1* | 4/2015 | Kakimoto ......... C23C 16/45534 438/791 |
| 2015/0217330 A1 | 8/2015 | Haukka et al. |
| 2016/0013042 A1 | 1/2016 | Hashimoto et al. |
| 2017/0140920 A1 | 5/2017 | Arnepalli et al. |
| 2017/0140931 A1 | 5/2017 | Van Cleemput et al. |
| 2018/0237912 A1 | 8/2018 | Takahashi et al. |
| 2019/0051511 A1 | 2/2019 | Kato et al. |
| 2019/0051512 A1 | 2/2019 | Kato et al. |
| 2019/0287787 A1 | 9/2019 | Nishino et al. |

FOREIGN PATENT DOCUMENTS

| | | |
|---|---|---|
| JP | 2012-138501 | 7/2012 |
| JP | 2013-135154 | 7/2013 |
| JP | 2017-092098 | 5/2017 |
| KR | 10-2015-0101431 | 9/2015 |
| KR | 10-2017-0000351 | 1/2017 |

* cited by examiner

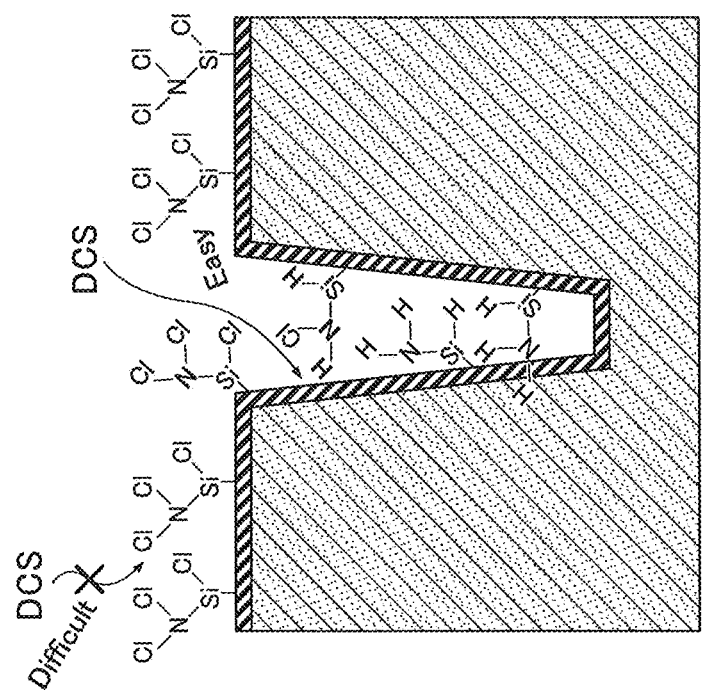
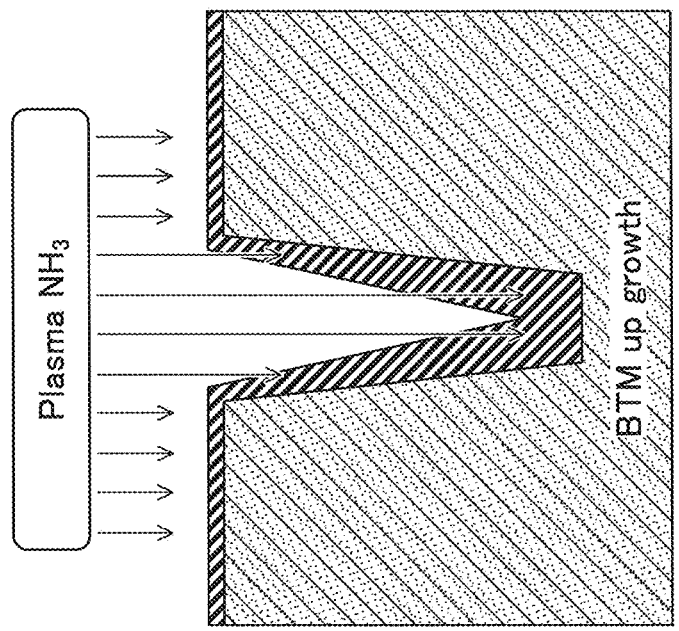
FIG.9C
FIG.9D

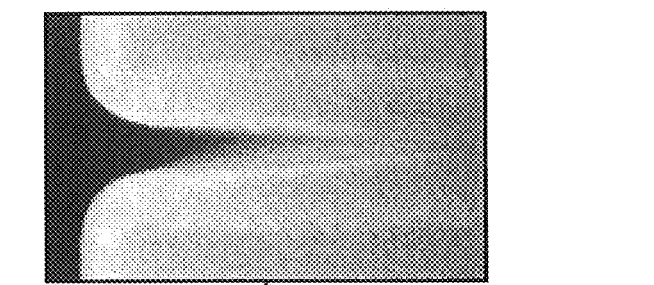
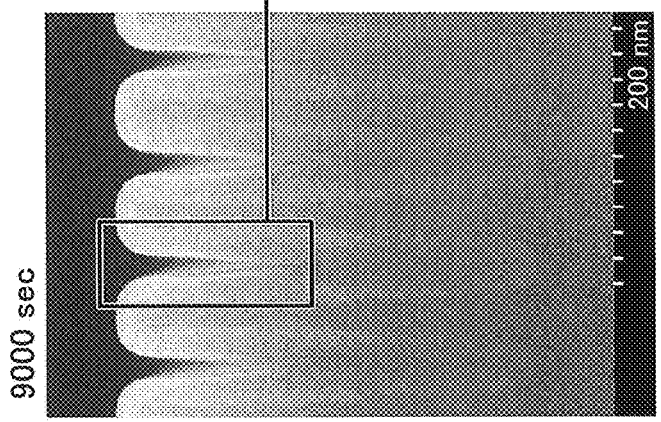
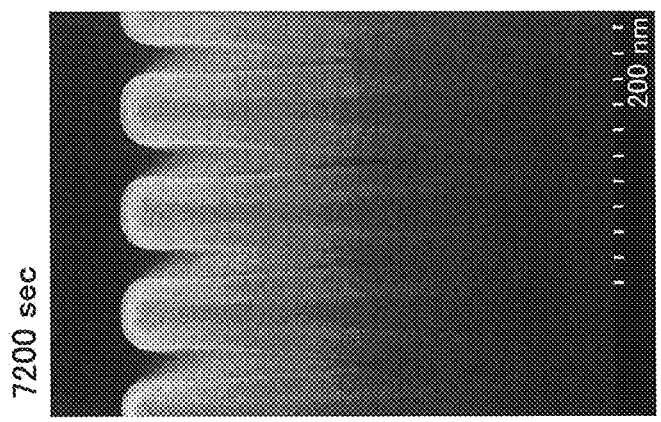
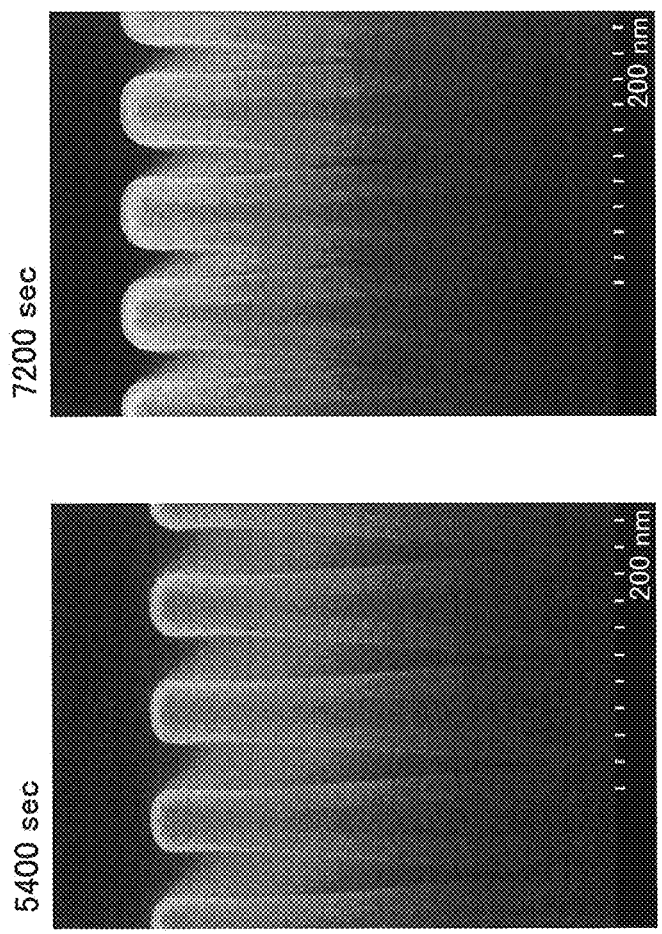

FILM DEPOSITION METHOD AND FILM DEPOSITION APPARATUS

CROSS-REFERENCE TO RELATED APPLICATION

The present application is based on Japanese Priority Application No. 2017-031528 filed on Feb. 22, 2017, the entire contents of which are hereby incorporated herein by reference.

BACKGROUND OF THE INVENTION

1. Field of the Invention

The present invention relates to a film deposition method and film deposition apparatus.

2. Description of the Related Art

Conventionally, as disclosed in Japanese Laid-Open Patent Application Publication No. 2013-135154, a film deposition method is known of causing a hydroxyl group to adsorb on an inner surface of a recessed portion formed in a substrate in a desired distribution, causing an organic aminosilane gas on the substrate on which the hydroxyl group is adsorbed, and supplying an oxidation gas to the substrate on which the organic aminosilane gas is adsorbed, thereby depositing a silicon oxide film in the recessed portion.

Such a film deposition method can deposit the film with a desired film thickness distribution by controlling an adsorption distribution of the hydroxyl group, thereby depositing a film with high bottom-up properties or depositing a film conformal to the shape of the recessed portion according to the intended purpose.

In the meantime, the above-mentioned film deposition with high bottom-up properties is being demanded for other types of film deposition such as nitriding films other than the silicon oxide film due to the increasing density and diversity of semiconductor integrated circuits.

SUMMARY OF THE INVENTION

The present invention is made in light of the above problems, and provides a film deposition method and film deposition apparatus that can fill a recess with a nitriding film with high bottom-up properties by using a simple process and apparatus.

According to an embodiment, there is provided a film deposition method is provided for filling a recessed pattern formed in a surface of a substrate with a film. In the method, an adsorption blocking group is formed by adsorbing chlorine gas activated by plasma on a top surface of the substrate and an upper portion of the recessed pattern. A source gas that contains one of silicon and a metal, and chlorine, is adsorbed on a lower portion of the recessed pattern where the adsorption blocking group is not formed, by supplying the source gas to the surface of the substrate including the recessed pattern. A molecular layer of a nitride film produced by a reaction of the source gas and a nitriding gas is deposited on the lower portion of the trench by supplying the nitriding gas to the surface of the substrate including the recessed pattern.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIGS. 9A through 9D are diagrams illustrating a series of processes of a film deposition method according to an embodiment of the present disclosure;

FIGS. 16A through 16D are show change of a filling state of a trench over time in a film deposition method of a working example 3;

DETAILED DESCRIPTION OF THE PREFERRED EMBODIMENTS

Embodiments of the present disclosure are described below with reference to the accompanying drawings.

First Embodiment (Film Deposition Apparatus)

Figure 1:
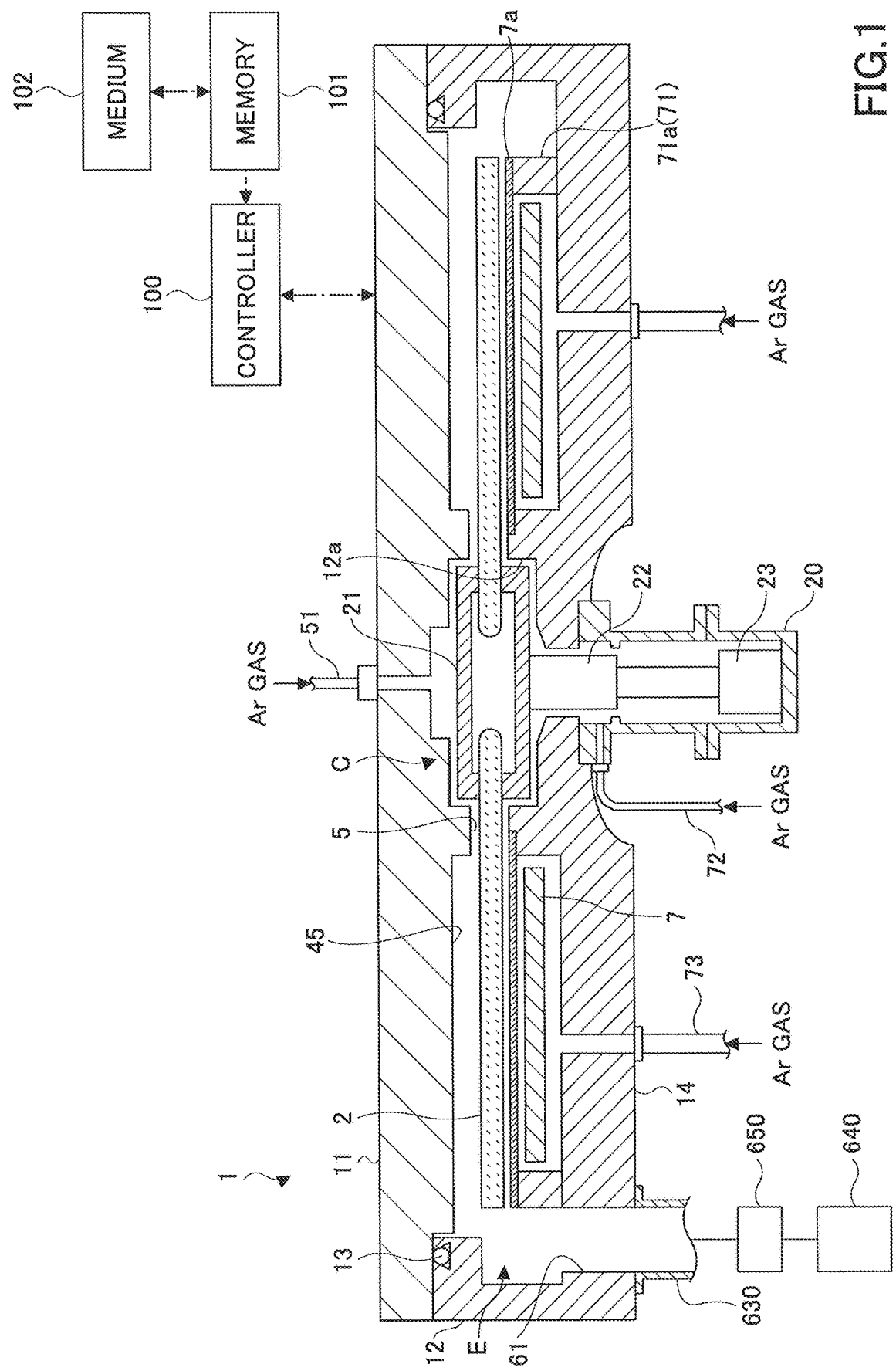
FIG. 1 a schematic cross-sectional view illustrating a film deposition apparatus according to an embodiment of the present disclosure.
Figure 2:
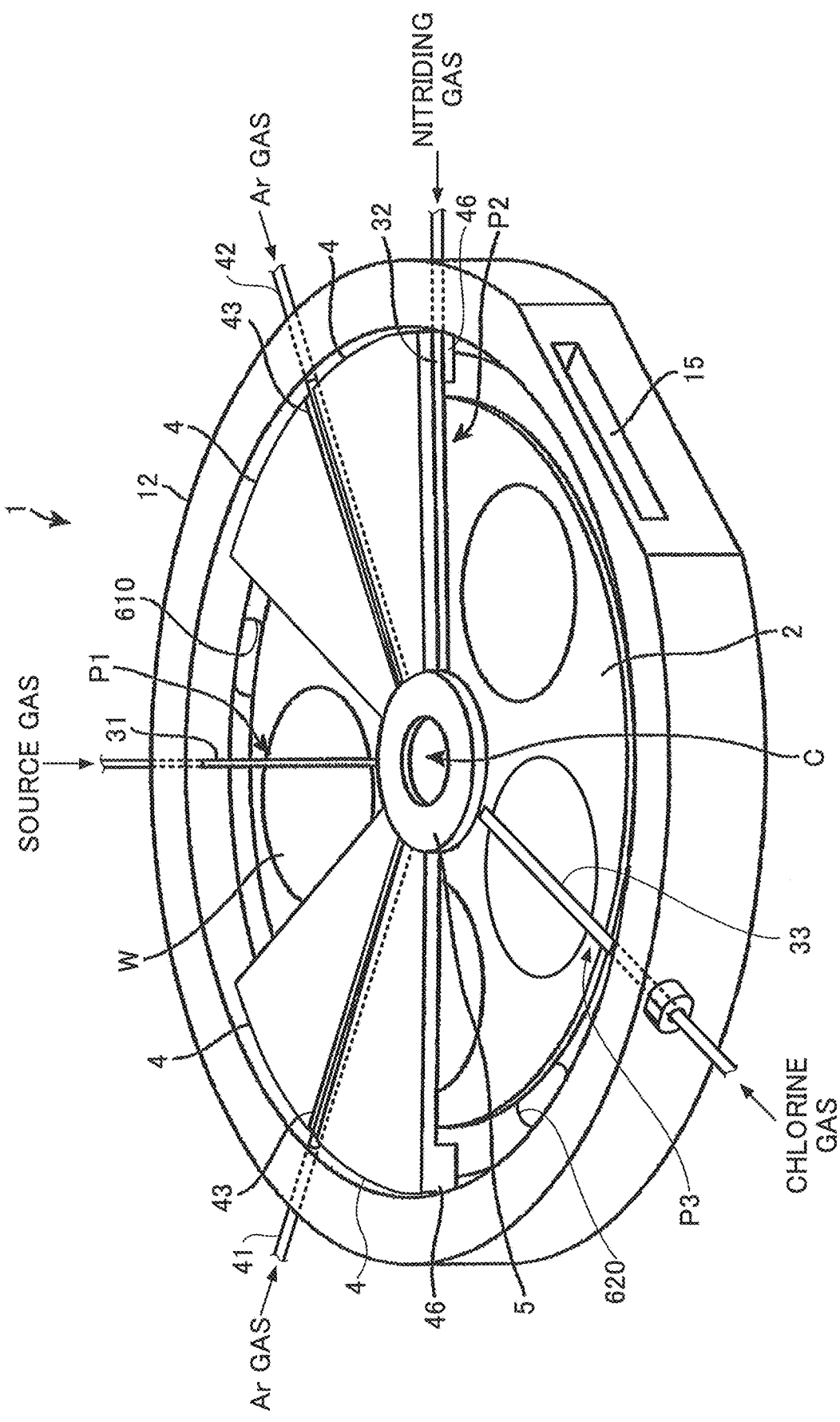
FIG. 2 is a schematic perspective view illustrating an inner structure of a vacuum chamber of a film deposition apparatus according to an embodiment of the present disclosure.
Figure 3:
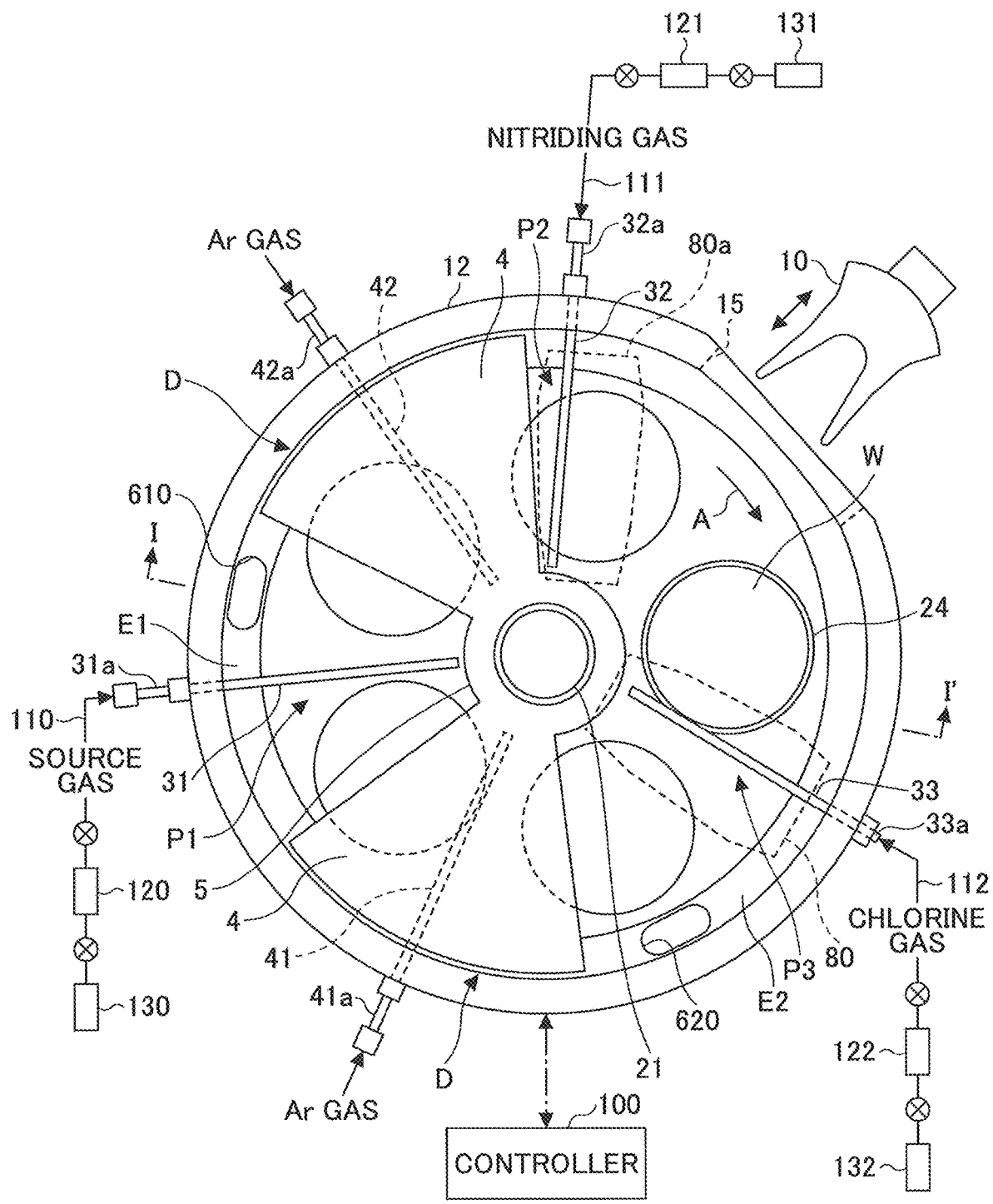
FIG. 3 is a schematic top view illustrating an inner structure of a vacuum chamber of a film deposition apparatus according to an embodiment of the present disclosure.

To begin with, a film deposition apparatus according to an embodiment of the present disclosure is described below. With reference to FIGS. 1 through 3, the film deposition apparatus includes a vacuum chamber 1 having a substantially flat circular shape, and a turntable 2 having a rotational axis coincident with the center of the vacuum chamber 1. The vacuum chamber 1 is a process chamber to accommodate a wafer therein and to deposit a film on a surface of the wafer. The vacuum chamber 1 includes a chamber body 12 having a cylindrical shape with a bottom surface, and a ceiling plate 11 placed on the upper surface of the chamber body 12. The ceiling plate 11 is detachably placed on the chamber body 12 via a sealing member 13 (FIG. 1) such as an O-ring in an airtight manner.

The turntable 2 is provided in the vacuum chamber 1. The turntable 2 is attached to a cylindrical shaped core unit 21 at its center portion. The core unit 21 is fixed to the upper end of a rotary shaft 22 that extends in the vertical direction. The rotary shaft 22 is provided to penetrate through a bottom portion 14 of the vacuum chamber 1, and the lower end of the rotary shaft 22 is attached to a driving unit 23 that rotates the rotary shaft 22 (FIG. 1) about a vertical axis. The rotary shaft 22 and the driving unit 23 are housed in the cylindrical case body 20 whose upper surface is open. The case body 20 is attached to a lower surface of the bottom portion 14 of the vacuum chamber 1 via a flange portion provided at its upper surface in an airtight manner so that inner atmosphere of the case body 20 is isolated from external atmosphere.

As illustrated in FIGS. 2 and 3, a plurality of (five in the example of the drawing) circular concave portions 24 is provided in a top surface of the turntable 2 along a rotating direction (circumferential direction) to receive the plurality of semiconductor wafers (which will be simply referred to as "wafers" hereinafter) W, respectively. In FIG. 3, only a single wafer W is illustrated in one of the concave portions 24 for an explanatory purpose. Each of the concave portions 24 is formed to have a slightly larger (for example, 4 mm larger) diameter than that (for example, 300 mm) of the wafer W, and to have a depth substantially equal to the thickness of the wafer W. Thus, when the wafer W is placed in the respective concave portion 24, the surface of the wafer W and the surface of the turntable 2 (where the wafer W is not placed) become almost the same height. Each of the concave portions 24 has three, for example, through holes formed in the bottom, through which lift pins for supporting a back surface of the respective wafer W and lifting the wafer W penetrate.

FIGS. 2 and 3 are diagrams for explaining an inner structure of the vacuum chamber 1. The ceiling plate 11 is not illustrated in FIGS. 2 and 3 for an explanatory purpose. As illustrated in FIGS. 2 and 3, a reaction gas nozzle 31, a reaction gas nozzle 32, a reaction gas nozzle 33, and separation gas nozzles 41 and 42, which are made of quartz, for example, are provided above the turntable 2. In the example illustrated in FIG. 3, the reaction gas nozzle 33, the separation gas nozzle 41, the reaction gas nozzle 31, the separation gas nozzle 42, and the reaction gas nozzle 32 are arranged in this order from a transfer port 15 (which will be explained later) in a clockwise direction (the rotation direction of the turntable 2 as illustrated by an arrow A in FIG. 3) with a space therebetween in a circumferential direction of the vacuum chamber 1. Gas introduction ports 31a, 32a, 33a, 41a, and 42a (FIG. 3) that are base portions of the nozzles 31, 32, 33, 41, and 42, respectively, are fixed to an outer peripheral wall of the chamber body 12 so that these nozzles 31, 32, 33, 41, and 42 are introduced into the vacuum chamber 1 from the outer peripheral wall of the vacuum chamber 1 so as to extend in a radial direction and parallel to the surface of the turntable 2.

In this embodiment, as illustrated in FIG. 3, the reaction gas nozzle 31 is connected to a supply source 130 (not illustrated in the drawings) of a source gas via a pipe 110, a flow controller 120 and the like (not illustrated in the drawings). The reaction gas nozzle 32 is connected to a supply source 131 (not illustrated in the drawings) of a nitriding gas via a pipe 111, a flow controller 121 and the like (not illustrated in the drawings). The reaction gas nozzle 33 is connected to a supply source 132 (not illustrated in the drawings) of chlorine ($Cl_2$) gas via a pipe 112, a flow controller 122 and the like (not illustrated in the drawings). The separation gas nozzles 41 and 42 are connected to supply sources (not illustrated in the drawings) of a separation gas via pipes and flow controller valves and the like, respectively. A noble gas such as helium (He) or argon (Ar) or inert gas such as nitrogen ($N_2$) gas can be used as the separation gas. The present embodiment is described by citing an example of using Ar gas as the separation gas.

Each of the reaction gas nozzles 31, 32 and 33 has a plurality of gas discharge holes 35 (see FIG. 4) that faces downward to the turntable 2 along the longitudinal directions of each of the reaction gas nozzles 31, 32 and 33 at intervals of 10 mm, for example. A region below the reaction gas nozzle 31 is a first process region P1 in which the source gas adsorbs on the wafers W. A region below the reaction gas nozzle 32 is a second process region P2 in which the nitriding gas that nitrides the source gas adsorbed on the wafer W is supplied, thereby producing a molecular layer of a nitride. The molecular layer of the nitride constitutes a film to be deposited. A region below the reaction gas nozzle 33 is a third process region P3 in which chlorine gas activated by plasma is supplied to the reaction product (nitride film) produced in the second process region P2, thereby forming an adsorption blocking group. Here, because the first process region P1 is a region where the source gas is supplied, the first process region P1 may be referred to as a source gas supply region P1. Similarly, because the second process region P2 is a region where the nitriding gas that reacts with the source gas and produces the nitride is supplied, the second process region P2 may be referred to as a nitriding gas supply region P2. Also, the third process region P3 is a region where chlorine gas is supplied, the third process region P3 may be referred to as a chlorine gas supply region P3.

A plasma generator 80 is provided over the third process region P3. A plasma generator 80a may be also provided over the second process region P2 as necessary. In FIG. 3, the plasma generators 80 and 80a are simply illustrated by a dotted line for an explanatory purpose. Details of the plasma generators 80 and 80a will be described below.

A gas that contains silicon and chlorine, or contains a metal and chlorine, is selected as the source gas. For example, when a silicon nitride (SiN) film is deposited, a gas that contains silicon and chlorine such as dichlorosilane (DCS, $SiH_2Cl_2$) is selected. In the meantime, for example, when a metal nitride film such as titanium nitride (TiN) and aluminum nitride (AlN) is deposited, a gas that contains a metal and chlorine such as titanium(IV) chloride ($TiCl_4$) and aluminum(III) chloride ($AlCl_3$) is selected as the source gas.

In general, ammonia ($NH_3$) gas is selected as the nitriding gas. A nitrogen ($N_2$) containing gas may be selected when the nitriding gas is supplied while being activated by plasma other than ammonia gas. Here, the nitriding gas may contain a carrier gas such as Ar in addition to ammonia.

Chlorine gas supplied from the third reaction gas nozzle 33 serves to form on a surface of a wafer W an adsorption blocking group that blocks the source gas supplied from the first reaction gas nozzle 31 from adsorbing on the surface of the wafer W. For example, when a recessed pattern such as a via hole and a trench is formed in the surface of the wafer W, by forming the adsorption blocking group on a top surface of the wafer W and an upper portion of the recessed pattern, a film does not become thick on the upper portion of the recessed pattern, and the film on a bottom side becomes thick, thereby allowing the film to deposit with high bottom-up properties. By nitriding the source gas, the source gas is terminated with hydrozyl group of $NH_2$ structure, which forms an adsorption site for the source gas. However, by supplying activated chlorine, a Cl group replaces an H group of the $NH_2$ structure. As discussed above, the source gas contains chlorine, and because chlorine does not adsorb on chlorine each other, the source gas does not adsorb on the location that is terminated with chlorine. Thus, the location terminated with Cl group serves as the adsorption blocking group, and blocks the adsorption of the source gas. Here, activated chlorine gas adsorbs on the upper portion of the recessed pattern because activated chlorine gas readily reaches the upper portion of the recessed pattern. However, because activated chlorine is unlikely to reach the lower portion and the bottom portion of the recessed pattern, density of the Cl group decreases with the decreasing distance from the bottom portion of the recessed pattern. Hence, the adsorption blocking group is formed densely on the upper portion of the recessed pattern and the top surface of the wafer W, but the adsorption blocking group is formed less densely on the lower portion (bottom portion) of the recessed pattern. Thus, the source gas is caused to adsorb on the lower portion of the recessed pattern more than the upper portion of the recessed pattern and the top surface of the wafer W, which enables the bottom-up deposition that starts the film deposition from the bottom portion of the recessed pattern. A detail of this point will be described below. Here, the gas supplied from the third reaction gas nozzle 33 may contain a carrier gas such as Ar in addition to chlorine gas.

Referring to FIGS. 2 and 3, the ceiling plate 11 includes two convex portions 4 in the vacuum chamber 1. As will be explained below, the convex portions 4 are attached to a lower surface of the ceiling plate 11 so as to protrude toward the turntable 2 to form separation regions D with the corresponding separation gas nozzles 41 and 42. Each of the convex portions 4 has substantially a fan-like planar shape where the apex is removed in an arc shape. For each of the convex portions 4, the inner arc shaped portion is connected to a protruding portion 5 (which will be explained below) and the outer arc shaped portion is formed to extend along an inner peripheral surface of the chamber body 12 of the vacuum chamber 1.

Figure 4:
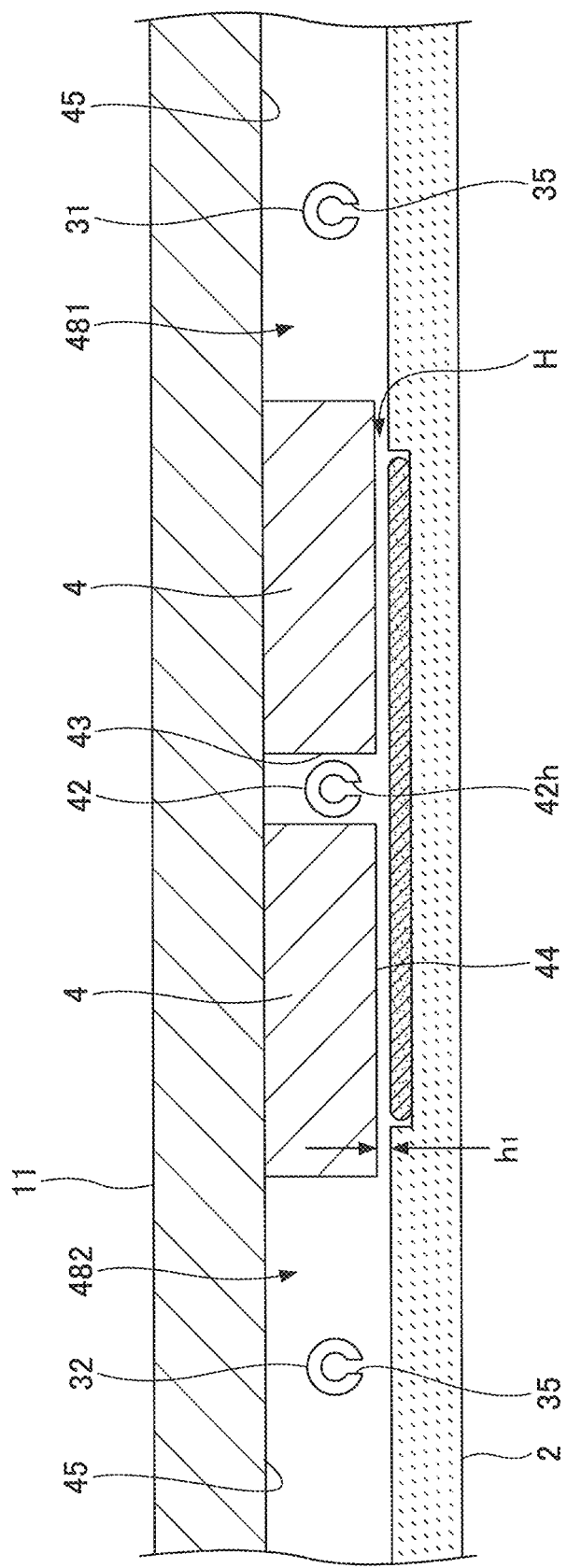
FIG. 4 is a schematic partial cross-sectional view of a vacuum chamber of a film deposition apparatus according to an embodiment of the present disclosure taken along a concentric circle of a turntable.

FIG. 4 illustrates a cross-section of the vacuum chamber 1 along a concentric circle of the turntable 2 from the reaction gas nozzle 31 to the reaction gas nozzle 32. As illustrated in FIG. 4, the convex portion 4 is fixed to the lower surface of the ceiling plate 11. Thus, the vacuum chamber 1 includes a flat low ceiling surface 44 (first ceiling surface) formed as the lower surface of the convex portion 4, and flat higher ceiling surfaces 45 (second ceiling surfaces) which are higher than the low ceiling surface 44 and formed on both sides of the low ceiling surface 44 in the circumferential direction. The low ceiling surface 44 has substantially a fan-like planar shape where the apex is removed in an arc shape. Furthermore, as illustrated in the drawings, the convex portion 4 includes a groove portion 43 at a center in the circumferential direction. The groove portion 43 is formed to extend in the radial direction of the turntable 2. The separation gas nozzle 42 is housed in the groove portion 43. Although not illustrated in FIG. 4, the separation gas nozzle 41 is also housed in a groove portion provided in the other convex portion 4. The reaction gas nozzles 31 and 32 are provided in spaces below the high ceiling surfaces 45, respectively. The reaction gas nozzles 31 and 32 are provided in the vicinity of the wafers W apart from the high ceiling surfaces 45, respectively. Here, the reaction gas nozzle 31 is provided in a space 481 below and on the right side of the high ceiling surface 45, and the reaction gas nozzle 32 is provided in a space 482 below and on the left side of the high ceiling surface 45.

Each of the separation gas nozzles 41 and 42 has a plurality of gas discharge holes 42h (see FIG. 4) formed along the longitudinal direction thereof at a predetermined interval (10 mm, for example).

The low ceiling surface 44 provides a separation space H, which is a narrow space, with respect to the turntable 2. When Ar gas is supplied from the separation gas nozzle 42 to the separation space H, this Ar gas flows toward the space 481 and the space 482 through the separation space H. On this occasion, because the volume of the separation space H is smaller than those of the spaces 481 and 482, the pressure in the separation space H can be made higher than those in the spaces 481 and 482 by Ar gas. It means that the separation space H having the higher pressure is formed between the spaces 481 and 482. Moreover, Ar gas flowing from the separation space H toward the spaces 481 and 482 serves as a counter flow against the source gas from the gas first process region P1 and the nitriding gas from the second process region P2. Thus, the source gas from the first process region P1 is separated from the nitriding gas from the second process region P2 by the separation space H. Therefore, mixing and reacting of the source gas with the nitriding gas are prevented in the vacuum chamber 1.

The height h1 of the low ceiling surface 44 above an upper surface of the turntable 2 is preferred to be appropriately determined based on the pressure of the vacuum chamber 1 during the film deposition, the rotational speed of the turntable 2, and a supplying amount of the separation gas (Ar gas) in order to maintain the pressure in the separation space H higher than those in the spaces 481 and 482.

Referring to FIGS. 1 through 3, the ceiling plate 11 further includes the protruding portion 5 at its lower surface to surround the outer periphery of the core unit 21 that supports the turntable 2. The protruding portion 5 is continuously formed with the inner portions of the convex portions 4 and has a lower surface that is formed at the same height as those of the low ceiling surfaces 44, in this embodiment.

Figure 5:
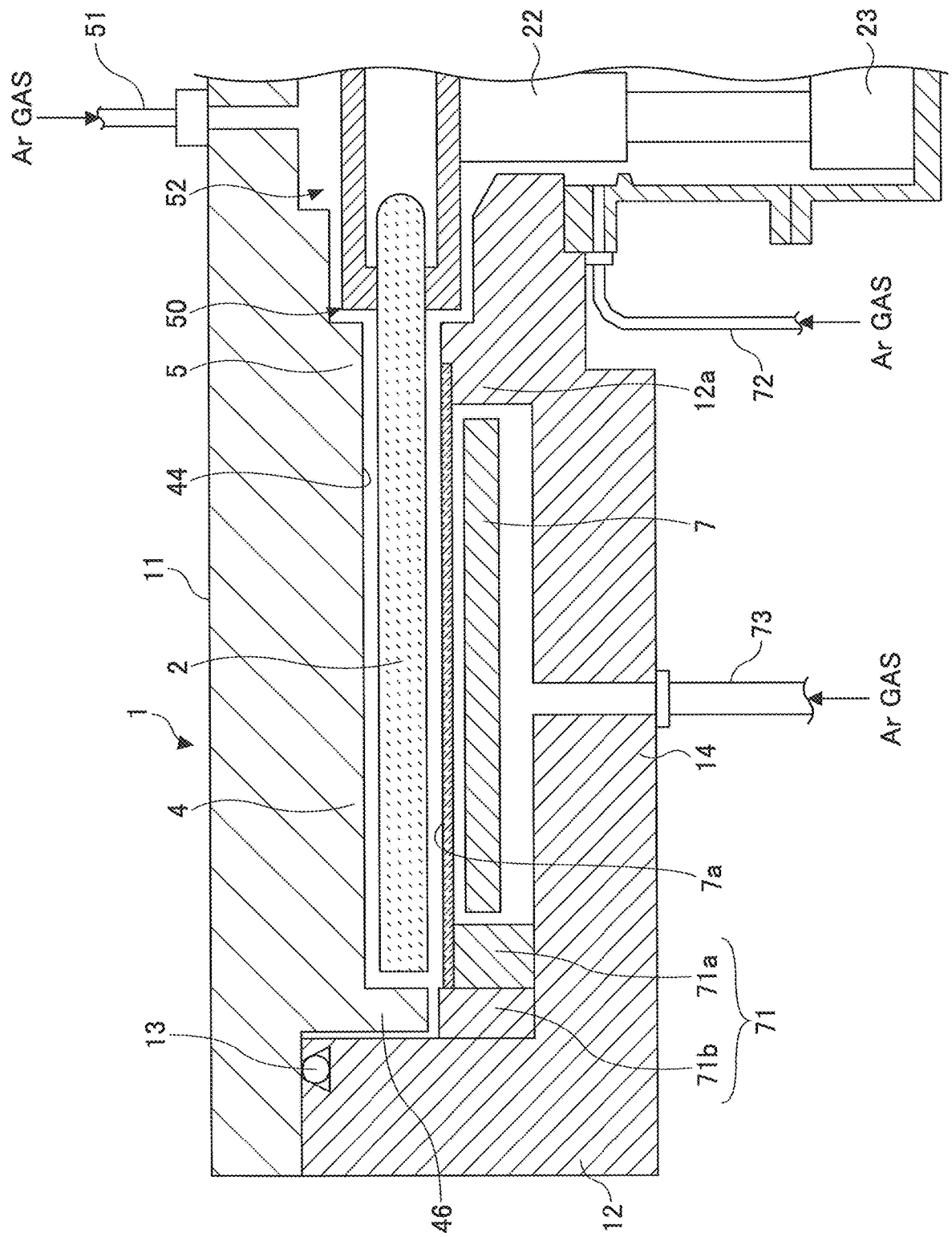
FIG. 5 is another schematic cross-sectional view of a film deposition apparatus according to an embodiment of the present disclosure.

FIG. 1 is a cross-sectional view taken along an I-I' line in FIG. 3, and illustrating an area where the ceiling surface 45 is provided. FIG. 5 is a partial cross-sectional view illustrating an area where the ceiling surface 44 is provided. As illustrated in FIG. 5, the convex portion 4 having a substantially fan-like planar shape includes an outer bending portion 46 at its outer peripheral end portion (at an outer peripheral end portion side of the vacuum chamber 1) which is bent to have an L-shape to face an outer end surface of the turntable 2. The outer bending portion 46 inhibits a flow of gas between the space 481 and the space 482 through the space between the turntable 2 and the inner peripheral surface of the chamber body 12. As described above, the convex portions 4 are provided on the ceiling plate 11 which is detachably attached to the chamber body 12. Thus, a slight space is provided between the outer periphery surface of the outer bending portion 46 and the chamber body 12. The spaces between the inner periphery surface of the outer bending portion 46 and an outer surface of the turntable 2, and the space between the outer periphery surface of the outer bending portion 46 and the chamber body 12 are set at the same size as the height h1 (see FIG. 4) of the low ceiling surface 44 with respect to the upper surface of the turntable 2, for example.

As illustrated in FIG. 5, the inner peripheral wall of the chamber body 12 is provided to extend in a vertical direction to be closer to the outer peripheral surface of the outer bending portion 46 at the separation region H. However, other than the separation region H, as illustrated in FIG. 1, for example, the inner peripheral wall of the chamber body 12 is recessed outward in a range from a location facing the outer end surface of the turntable 2 to the upper end of the bottom portion 14. Hereinafter, for an explanatory purpose, the concave portion, having a substantially rectangular cross-sectional view, is referred to as an "evacuation region." Specifically, a part of the evacuation region which is in communication with the first process region P1 is referred to as a first evacuation region E1, and a part of the evacuation region which is in communication with the second and third process regions P2 and P3 is referred to as a second evacuation region E2. As illustrated in FIGS. 1 through 3, a first evacuation port 610 and a second evacuation port 620 are respectively provided at the bottom portions of the first evacuation region E1 and the second evacuation region E2. The first evacuation port 610 and the second evacuation port 620 are connected to vacuum pumps 640, which are vacuum evacuation units, via evacuation pipes 630, respectively, as illustrated in FIG. 1. Moreover, a pressure controller 650 is provided between the vacuum pumps 640 and the evacuation pipes 630 in FIG. 1.

As illustrated in FIGS. 2 and 3, although a separation region H is not provided between the second process region P2 and the third process region P3, as illustrated in FIG. 3, a casing that partitions a space above the turntable 2 is provided in a region illustrated as the plasma generator 80. Otherwise, when the casing is not provided for the plasma generator 80, a casing is provided for the plasma generator 80a, and the space between the second process region P2 and the third process region P3 is partitioned. This point will be described later in detail.

As illustrated in FIGS. 1 and 5, a heater unit 7, which is a heating device, is provided in a space between the bottom portion 14 of the vacuum chamber 1 and the turntable 2, and heats a wafer W on the turntable 2 via the turntable 2 up to a temperature determined by a process recipe (e.g., 400° C.). As illustrated in FIG. 5, a ring-shaped cover member 71 is provided below, at and near the periphery of the turntable 2 to prevent a gas from entering an area under the turntable 2 by separating an atmosphere from a space above the turntable 2 to the evacuation regions E1 and E2 from an atmosphere in which the heater unit 7 is placed. The cover member 71 includes an inner member 71a provided under the periphery and outside of the turntable 2 and an outer member 71b provided between the inner member 71a and the inner side wall of the vacuum chamber 1. The outer member 71b is provided to face the outer bending portion 46, which is formed at an outer edge portion at lower side of each of the convex portions 4. The inner member 71a is provided to surround the entirety of the heater unit 7 below the outer end portion (and at a slightly outer side of the outer edge portion) of the turntable 2.

The bottom portion 14 of the vacuum chamber 1 closer to the rotation center than the space where the heater unit 7 is provided protrudes upward to be close to the core unit 21 to form a projecting portion 12a. A narrow space is provided between the projecting portion 12a and the core unit 21. Furthermore, a narrow space is provided between an inner peripheral surface of the bottom portion 14 and the rotary shaft 22 to be in communication with the case body 20. A purge gas supplying pipe 72 which supplies Ar gas as the purge gas to the narrow space for purging is provided in the case body 20. The bottom portion 14 of the vacuum chamber 1 includes a plurality of purge gas supplying pipes 73 (only one of the purge gas supplying pipes 73 is illustrated in FIG. 5) which are provided at a predetermined angle interval in the circumferential direction below the heater unit 7 for purging the space where the heater unit 7 is provided. Moreover, a cover member 7a is provided between the heater unit 7 and the turntable 2 to prevent the gas from going into the space where the heater unit 7 is provided. The cover member 7a is provided to extend from an inner peripheral wall (upper surface of the inner member 71a) of the outer member 71b to an upper end portion of the projecting portion 12a in the circumferential direction. The cover member 7a may be made of quartz, for example.

The film deposition apparatus 1 further includes a separation gas supplying pipe 51 that is connected to a center portion of the ceiling plate 11 of the vacuum chamber 1 and is provided to supply Ar gas as the separation gas to a space 52 between the ceiling plate 11 and the core unit 21. The separation gas supplied to the space 52 flows through a narrow space between the protruding portion 5 and the turntable 2 so as to flow along the top surface of the turntable 2 where the wafers W are to be placed and is discharged toward the outer periphery. The space 50 is kept at a pressure higher than those of the space 481 and the space 482 by the separation gas. Thus, the mixing of the source gas supplied to the first process region P1 and the nitriding gas supplied to the second process region P2 by flowing through the center area C can be prevented by the space 50. It means that the space 50 (or the center area C) can function similarly to the separation space H (or the separation region D).

In addition, as illustrated in FIGS. 2 and 3, a transfer port 15 is formed in a side wall of the vacuum chamber 1 for allowing the wafers W, which are substrates, to pass between an external transfer arm 9 and the turntable 2. The transfer port 15 is opened and closed by a gate valve (not illustrated in the drawings). Furthermore, lift pins, which penetrate through the concave portion 24 to lift up the wafer W from a backside surface, and a lifting mechanism for the lift pins (both are not illustrated in the drawings) are provided at a location where the wafer W is transferred and below the turntable 2 because the wafer W is transferred between the external transfer arm 9 and the concave portion 24 of the turntable 2, which is a substrate receiving area, at a location facing the transfer port 15.

Figure 6:
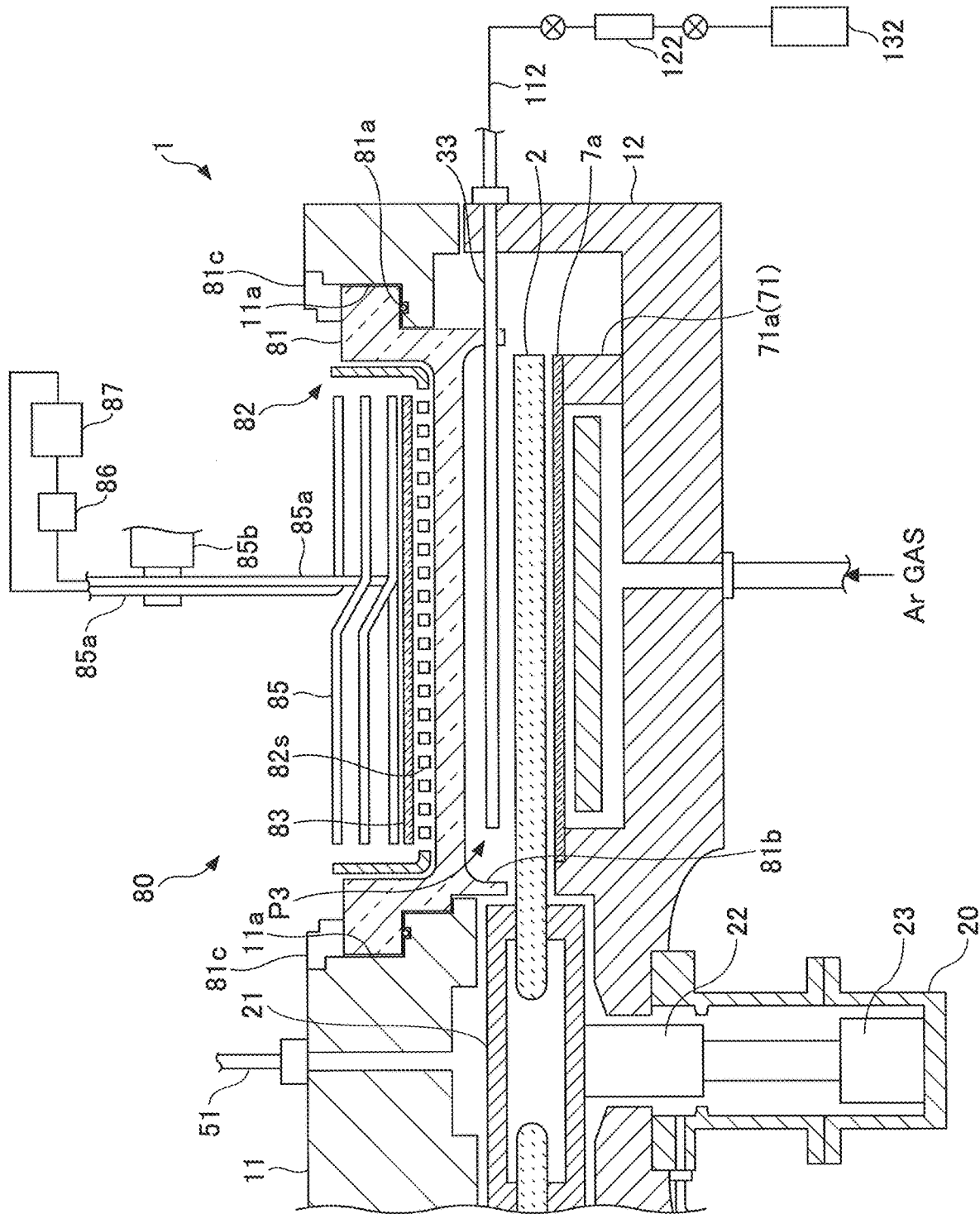
FIG. 6 is a schematic cross-sectional view of a plasma generator provided in a film deposition apparatus according to an embodiment of the present disclosure.
Figure 7:
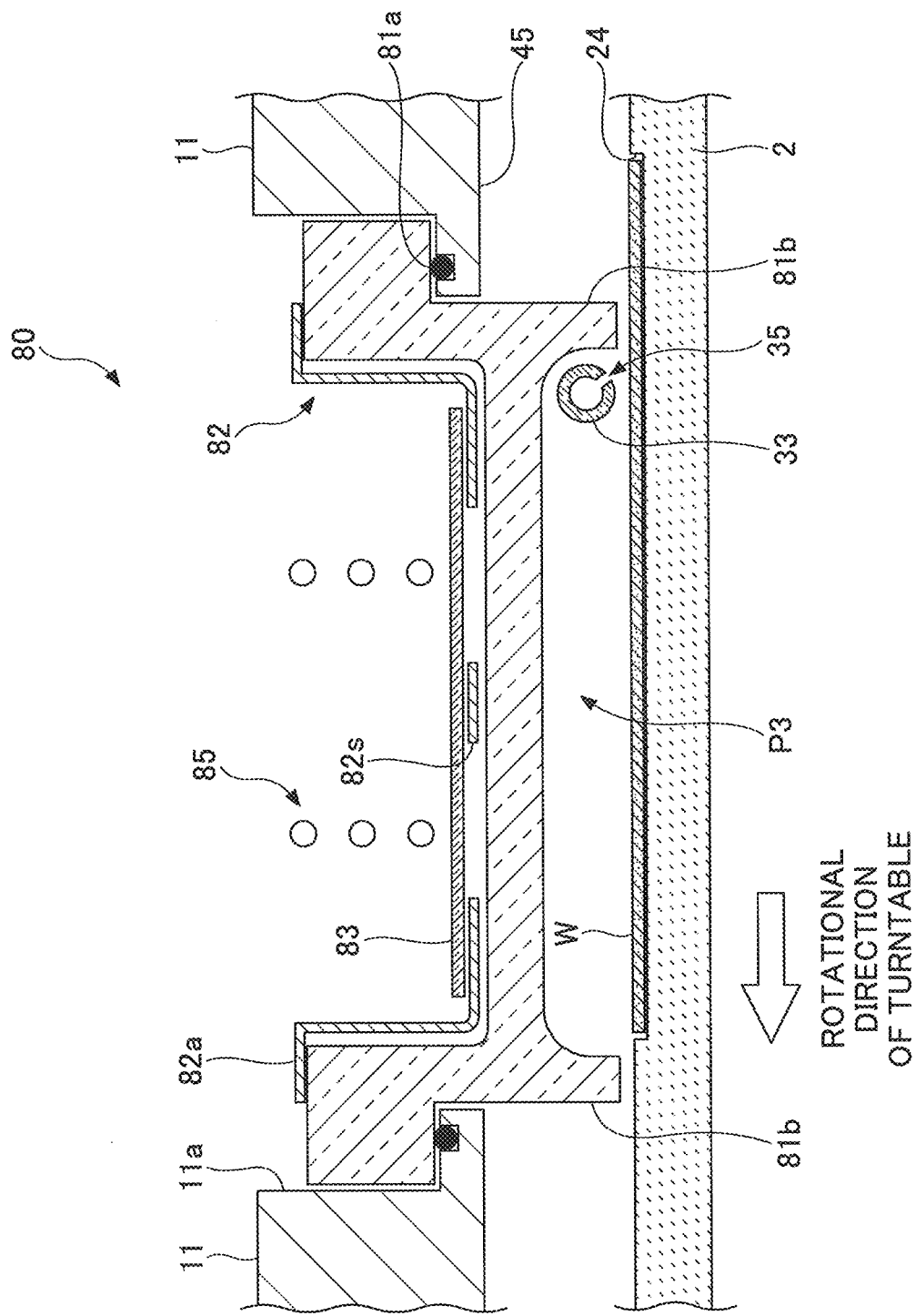
FIG. 7 is another schematic cross-sectional view of a plasma generator according to an embodiment of the present disclosure.
Figure 8:
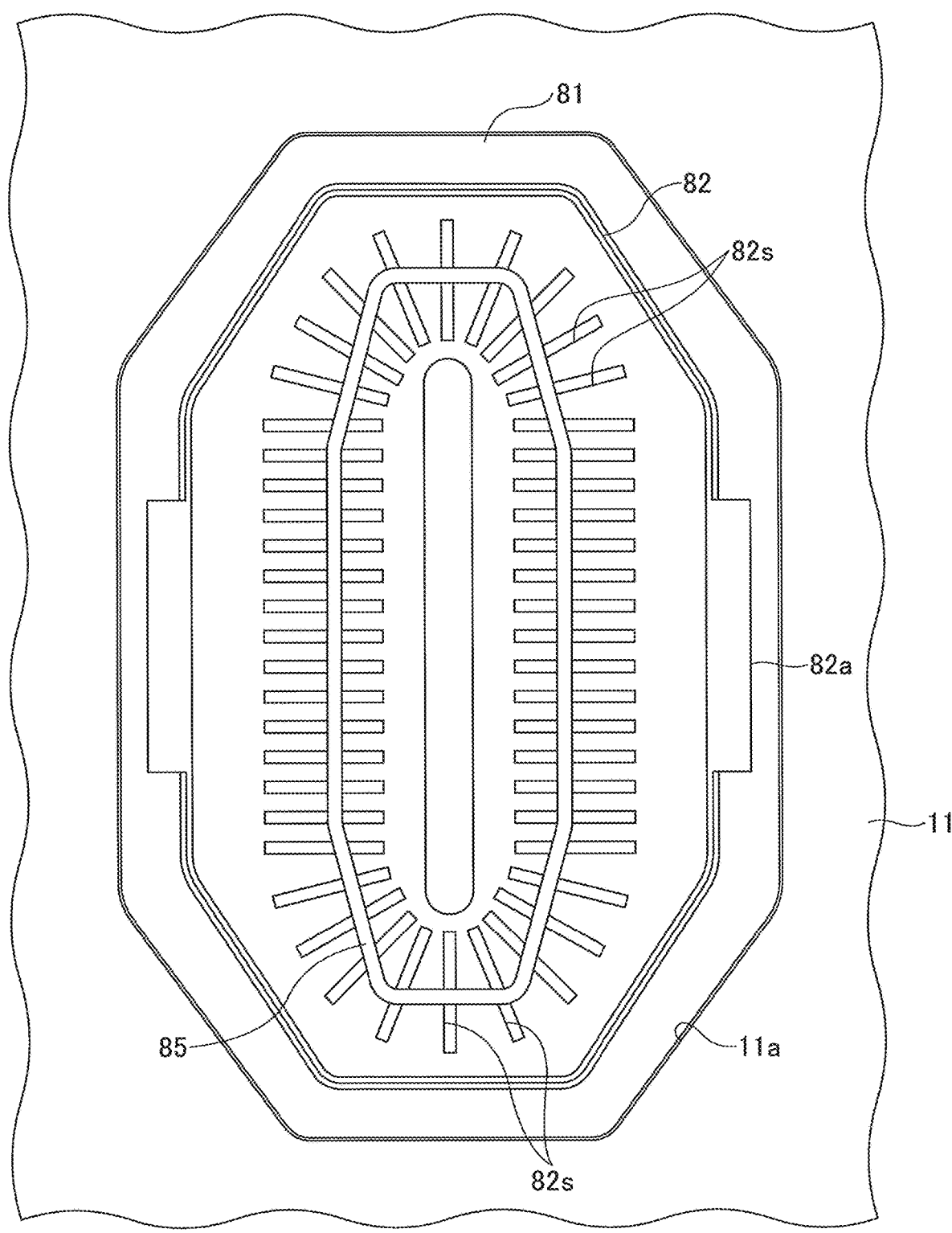
FIG. 8 is a schematic top view of a plasma generator according to an embodiment of the present disclosure.

Next, the plasma generator 80 is described below with reference to FIGS. 6 through 8. FIG. 6 is a schematic cross-sectional view of the plasma generator 80 taken along the radial direction of the turntable 2. FIG. 7 is a schematic cross-sectional view of the plasma generator 80 taken along a direction perpendicular to the radial direction of the turntable 2. FIG. 8 is a schematic top view illustrating the plasma generator 80. For an explanatory purpose, parts of the components are not illustrated in the drawings.

Referring to FIG. 6, the plasma generator 80 is made of a material that transmits radio frequency waves, and has a concave portion in its upper surface. The plasma generator 80 further includes a frame member 81 that is embedded in an opening 11a provided in the ceiling plate 11, a Faraday shield plate 82 housed in the concave portion of the frame member 81 and having substantially a box shape whose top is opened, an insulating plate 83 placed on a bottom surface of the Faraday shield plate 82, and a coil antenna 85 supported by the insulating plate 83 thereon. The antenna 85 has substantially an octagonal planar shape.

The opening 11a of the ceiling plate 11 is formed to have a plurality of step portions, and one of the step portions has a groove portion to extend along the perimeter where a sealing member 81a such as an O-ring or the like is embedded. The frame member 81 is formed to have a plurality of step portions that correspond to the step portions of the opening 11a, and when the frame member 81 is engaged in the opening 11a, a back side surface of one of the step portions contacts the sealing member 81a embedded in the opening 11a so that the ceiling plate 11 and the frame member 81 are kept in an air-tight manner. Moreover, as illustrated in FIG. 6, a pushing member 81c, which extends along the outer periphery of the frame member 81 that is fitted in the opening 11a of the ceiling plate 11, is provided so that the frame member 81 is pushed downward with respect to the ceiling plate 11. Thus, the ceiling plate 11 and the frame member 81 are further kept in an air-tight manner.

The lower surface of the frame member 81 is positioned to face the turntable 2 in the vacuum chamber 1 and a projection portion 81b that projects downward (toward the turntable 2) is provided at the perimeter at the lower surface. The lower surface of the projection portion 81b is close to the surface of the turntable 2 and a space (hereinafter referred to as the third process region P3) is surrounded by the projection portion 81b, the surface of the turntable 2 and the lower surface of the frame member 81 above the turntable 2. The space between the lower surface of the projection portion 81b and the surface of the turntable 2 may be the same as the height h1 between the ceiling surface 44 and the upper surface of the turntable 2 in the separation space H (FIG. 4).

In addition, the reaction gas nozzle 33 that penetrates through the projection portion 81b is provided in the third process region P3. In this embodiment, as illustrated in FIG. 6, the chlorine gas supply source 132 filled with chlorine gas is connected to the reaction gas nozzle 33 through the pipe 112 via the flow controller 122. Chlorine gas whose flow rate is controlled by the flow controller 122 is activated by the plasma generator 80 and is supplied to the third process region P3 at a predetermined flow rate.

The reaction gas nozzle 33 has a plurality of gas discharge holes 35 formed along the longitudinal direction thereof at a predetermined interval (10 mm, for example), and the above-mentioned chlorine gas is discharged from the gas discharge holes 35. As illustrated in FIG. 7, the gas discharge holes 35 are provided to be inclined from a vertical direction with respect to the turntable 2 toward the upstream rotational direction of the turntable 2. Due to this, the gas supplied from the reaction gas nozzle 33 is discharged in a direction opposite to the rotational direction of the turntable 2, specifically, toward a gap between a lower surface of the projection portion 81b and the surface of the turntable 2. Thus, the flows of the reaction gas and the separation gas from a space below the ceiling surface 45 that is upstream of the plasma generator 80 toward the third process region P3 along the rotation direction of the turntable 2 can be prevented. Furthermore, as described above, because the projection portion 81b that is formed along an outer periphery of the lower surface of the frame member 81 is close to the surface of the turntable 2, the pressure in the third process region can be kept high by the gas from the reaction gas nozzle 33. This also prevents the reaction gas and the separation gas from flowing into the third process region P3.

Thus, the frame member 81 plays a role in separating the third process region P3 from the second process region P2. Hence, although the film deposition apparatus according to the embodiments does not have to include the whole of the plasma generator 80, the film deposition apparatus according to the embodiments includes the frame member 81 to separate the third process region P3 from the second process region P2 and to prevent the nitriding gas being mixed into chlorine gas.

The Faraday shield plate 82 is made of a conductive material such as a metal and is grounded, although not illustrated in the drawings. As clearly illustrated in FIG. 8, the Faraday shield plate 82 has a plurality of slits 82s at its bottom portion. Each of the slits 82s extends substantially perpendicularly to a corresponding side of the antenna 85 that has the substantially octagonal planar shape.

As illustrated in FIGS. 7 and 8, the Faraday shield plate 82 includes two support portions 82a that are provided at upper end portions to bend outward. The support portions 82a are supported by the upper surface of the frame member 81 so that the Faraday shield plate 82 is supported at a predetermined position in the frame member 81.

The insulating plate 83 is made of fused quartz, for example, has a size slightly smaller than that of the bottom surface of the Faraday shield plate 82, and is mounted on the bottom surface of the Faraday shield plate 82. The insulating plate 83 insulates the Faraday shield plate 82 from the antenna 85 while passing the radio frequency waves radiated from the antenna 85 downward.

The antenna 85 is formed by winding a pipe made of copper three times, for example, in a substantially octagonal planar shape. Thus, cooling water can be circulated in the pipe, and the antenna 85 is prevented from being heated to a high temperature by the radio frequency waves supplied to the antenna 85. As illustrated in FIG. 6, the antenna 85 includes a standing portion 85a to which a support portion 85b is attached. The antenna 85 is maintained at a predetermined position in the Faraday shield plate 82 by the support portion 85b. The radio frequency power source 87 is connected to the support portion 85b via the matching box 86. The radio frequency power source 87 is capable of generating radio frequency power having a frequency of 13.56 MHz, for example.

According to the plasma generator 80 thus structured, when the radio frequency power source 87 supplies the radio frequency power to the antenna 85 via the matching box 86, the antenna 85 generates an electromagnetic field. In the electromagnetic field, the Faraday shield plate 82 cuts the electric field component so as not to transmit the electric field component downward. On the other hand, the magnetic field component is transmitted into the third process region P3 through the plurality of slits 82s of the Faraday shield plate 82. The magnetic field component activates chlorine gas supplied to the third process region P3 from the reaction gas nozzle 33 at a predetermined flow rate. Here, the supply of chlorine gas is intended to cause chlorine gas to adsorb on an upper portion of the recessed pattern of the wafer W so as to form an adsorption blocking group on the upper portion of the recessed pattern, but is not intended to etch the film. Hence, converting chlorine gas to plasma is performed to the extent that chlorine gas does not exert the etching action. The plasma generated in this manner can adsorb on the upper portion of the recessed pattern formed in the surface of the wafer W such as a via hole and a trench, and can form the adsorption blocking group against the source gas, and thereby can deposit a film from the bottom portion where the adsorption of the source gas is not blocked by the adsorption blocking group. Here, to reduce the plasma intensity, an embodiment that uses a remote plasma generator as the plasma generator 80 is considered, but this point will be described below.

The plasma generator 80a provided at the second process region P2 as necessary may be configured similar to the plasma generator 80. As long as the plasma generator 80a can activate the nitriding gas, a variety of configurations of plasma generators can be used as the plasma generator 80a. However, using the plasma generator 80a having the same configuration as the plasma generator 80 can facilitate the arrangement of the plasma generator 80a and can reduce the cost.

As illustrated in FIG. 1, the film deposition apparatus according to the present embodiment further includes a controller 100 that is constituted of a computer and controls the entirety of the film deposition apparatus. A memory in the controller 100 stores a program by which the film deposition apparatus executes the film deposition method (as will be described below) under a control of the control unit 100. The program is formed to include steps capable of executing the film deposition method, and is stored in a medium 102 such as a hard disk, a compact disc, a magneto-optic disk, a memory card, and a flexible disk. A predetermined reading device reads the program into a storage part 101, and the program is installed in the controller 100.

[Film Deposition Method]

Figures 9A, 9B:
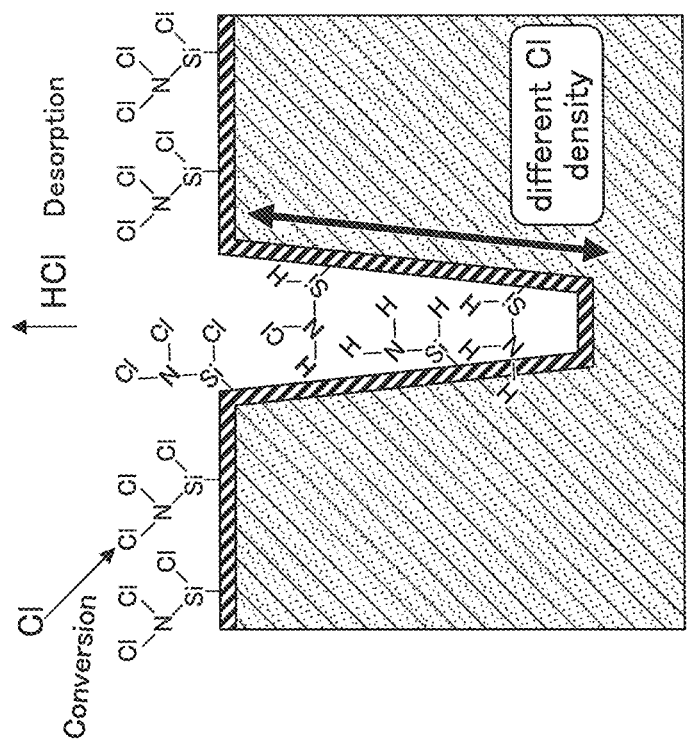

Next, a film deposition method according to a first embodiment of the present invention is described below by citing an example of using the above-mentioned film deposition apparatus, with reference to FIGS. 9A through 9D. FIGS. 9A through 9D are diagrams illustrating an example of a series of processes of the film deposition method according to the first embodiment of the present disclosure. FIG. 9A is a state of wafer W before starting the film deposition method according to the first embodiment of the present disclosure.

In this embodiment, a silicon wafer is used as the wafer W and the silicon wafer has a trench T (concave portion) as illustrated in FIG. 9A. An undercoat film of silicon nitride (SiN) is formed on a surface in the trench T and a surface S of the wafer W. The SiN film is terminated with an H group having an $NH_2$ structure. This is because the SiN film is nitrided by an $NH_3$-containing gas when the SiN film is deposited. The embodiment is described below by citing an example of supplying dichlorosilane (DCS, $SiH_2Cl_2$) from the reaction gas nozzle 31, supplying ammonia ($NH_3$) as the nitriding gas from the reaction gas nozzle 32, and supplying chlorine ($Cl_2$) from the reaction gas nozzle 33. Moreover, an example of mounting both of the plasma generator 80 and 80a on the film deposition apparatus and supplying both of chlorine gas and ammonia gas while being activated and converted to ions and radicals, is described below.

First, a gate valve (not illustrated in the drawings) is opened, and the transfer arm 10 (FIG. 3) transfers the wafer W from the outside to the concave portion 24 of the turntable 2 via the transfer port 15 (FIG. 2 and FIG. 3). This transfer is performed by raising and lowering the lift pins (not illustrated in the drawings) via through holes provided in the bottom surface of the concave portion 24 from the bottom portion side of the vacuum chamber 1 when the concave portion 24 stops at a position facing the transfer port 15. By repeating such a wafer transfer while intermittently rotating the turntable 2, the wafers W are loaded into the respective concave portions 24.

Then, the gate valve is closed, and the vacuum pump 640 evacuates the vacuum chamber 1 to the attainable degree of vacuum. Then, the separation gas nozzles 41 and 42 discharges Ar gas as a separation gas at a predetermined flow rate. At this time, the separation gas supplying pipe 51 and the purge gas supplying pipes 72 and 73 also discharge Ar gas at a predetermined flow rate, respectively. With this, the pressure regulator 650 (FIG. 1) controls the vacuum chamber 1 to a preset processing pressure. Then, the heater unit 7 heats the wafers W to 400° C., for example, while the turntable 2 is rotated in a clockwise direction at a rotational speed of 5 rpm, for example. The rotational speed of the turntable 2 can be set at a variety of rotational speeds depending on the intended purpose. Also, the plasma generators 80 and 80a are turned on.

Subsequently, the reaction gas nozzle 31 (FIG. 2 and FIG. 3) supplies DCS, and the reaction gas nozzle 32 supplies ammonia gas. Furthermore, the reaction gas nozzle 33 supplies chlorine gas. The plasma generators 80 and 80a activate chlorine gas and ammonia gas.

By the rotation of the turntable 2, the wafer W repeatedly passes through the third process region P3, the separation region D, the first process region P1, the separation region D, and the second process region P2 in this order (see FIG. 3). On this occasion, although each of the wafers W starts the process from different locations of the process regions P1 through P3 or separation regions D depending on the first placed location when the turntable 2 starts rotating, the case where each of the wafers W starts from the third process region P3 is described below for the purpose of illustration.

FIG. 9B is a diagram illustrating an example of an adsorption blocking group forming process. As illustrated in FIG. 9B, when the wafer W passes through the third process region P3, chlorine gas activated by plasma (chlorine radicals and chlorine ions) is supplied to an undercoat film UF in the trench T. Chlorine gas produces HCl by reacting with H groups and forms Cl group terminations by replacing the H groups with itself. Such Cl groups form the adsorption blocking groups against a chlorine-containing gas. Here, chlorine gas readily reaches the surface S of the wafer W and the upper portion of the trench T, but scarcely reaches a deep portion of the trench T that is the lower portion near the bottom portion of the trench T. Most of chlorine gas replaces the H groups with itself before reaching the deep portion of the trench T because the aspect ratio of the trench T is high. Hence, the chlorine groups that are the adsorption blocking groups are densely formed on the surface S of the wafer W and the upper portion of the trench T, and many H groups of the $NH_2$ structure remain on the lower portion of the trench T, which means the density of the Cl groups is low in the lower portion of the trench T.

FIG. 9C is a diagram illustrating an example of a source gas adsorption process. As illustrated in FIG. 9C, after the wafer W is purged by a supplied purge gas when passing through the separation region D, DCS is supplied to the wafer W when the wafer W passes through the first process region P1. DCS does not adsorb very much on the region where the adsorption blocking groups are present because DCS and the adsorption blocking groups both contain chlorine atoms and because chlorine atoms do not adsorb to each other. In contrast, DCS adsorbs much on the region where the adsorption blocking groups are not present because $NH_2$ groups serve as an adsorption site for a silicon-containing gas such as DCS. In other words, DCS that is the source gas adsorbs densely on and near the bottom portion in the trench T, and adsorbs on the upper portion of the trench and the surface S of the wafer W at a low density.

FIG. 9D is a diagram illustrating an example of a nitriding film deposition process. As illustrated in FIG. 9D, after the wafer W is purged by a supplied purge gas when passing through the separation region D, $NH_3$ gas activated by plasma is supplied to the wafer W when the wafer W passes through the second process region P2. By supplying $NH_3$ gas, DCS adsorbed in the trench T and supplied $NH_3$ react with each other, and a molecular layer of a SiN film is formed as a reaction product. Here, because DCS adsorbs much on and around the bottom portion of the trench T, the SiN film is formed much on and around the bottom portion. Hence, the film deposition with high bottom-up properties for filling the trench T as illustrated in FIG. 9S can be achieved.

Next, when the wafer W passes through the third process region P3, the wafer W goes into a state as illustrated in FIG. 9B again, and Cl groups that are the adsorption blocking groups adsorb on the upper portion of the trench T and the surface S of the wafer W.

Hereinafter, by rotating the turntable 2 repeatedly while supplying the respective reaction gases, a cycle illustrated from FIGS. 9B to 9D is repeated, thereby depositing the SiN film from the bottom side without blocking the opening of the trench T. In addition, as illustrated in FIG. 9D, film deposition of the SiN film with high bottom-up properties and without blocking the opening can be performed while a cross section having a V-letter shape is formed. Finally, the trench T can be filled up with a seamless nitriding film, and the high-quality film deposition to fill the trench T with the nitriding film can be performed without generating a void and the like.

Thus, according to the film deposition of the embodiment of the present disclosure, by performing the film deposition by ALD (Atomic Layer Deposition) while forming the adsorption blocking groups by supplying activated chlorine gas to the upper portion of the trench T and using a source gas that contains chlorine, selective film deposition with high bottom-up properties can be achieved.

Here, $NH_3$ does not need necessarily to be supplied by being activated by plasma, and $NH_3$ may be supplied without being converted to plasma as long as the nitriding is possible.

Moreover, the present embodiment is described by citing an example in which the undercoat film UF of SiN is formed on the surface S of the wafer W and the inner surface of the trench T from the beginning, but the undercoat film UF does not need to be formed from the beginning. The SiN film can be directly deposited on a Si substrate to fill the SiN film into the trench T. Furthermore, even when the undercoat film UF is preliminarily provided, the undercoat film UF is not limited to the SiN film, and for example, an $SiO_2$ film may be used.

In addition, the film deposition apparatus may deposit the undercoat film UF at first on the wafer W on which the undercoat film UF is not formed, instead of depositing the film on the surface of the wafer W on which the undercoat film UF is already formed from the beginning, and then may deposit the SiN film to fill the trench T with the SiN film by performing the cycle illustrated in FIG. 9B through 9D.

When the undercoat film UF is deposited at first, after the wafer W is carried into the vacuum chamber 1, the undercoat film UF is deposited by supplying the silicon-containing gas from the first reaction gas nozzle 31 and supplying the nitriding gas from the second reaction gas nozzle 32 without supplying chlorine gas from the third reaction gas nozzle 33. Because the conformal film deposition along the shape of the trench T is desired to deposit the undercoat film UF, not the film deposition with high bottom-up properties, the film deposition process only has to be performed without forming the adsorption blocking groups. On this occasion, a silicon-containing gas other than DCS, and an oxidation gas, not the nitriding gas, can be used to deposit the film. However, from the point of view of performing an efficient process, the undercoat film UF is preferably deposited by using the same source gas as that used in the filling process and the same reaction gas as the nitriding gas used in the filling process. Hence, in the present embodiment, DCS is preferably uses as the source gas, and ammonia gas is preferably used as the nitriding gas.

The film deposition of the undercoat film UF means that the process in FIG. 9A is performed by the film deposition apparatus in the present embodiment. Hence, by consecutively performing the processes from FIG. 9B to FIG. 9D, the film deposition apparatus of the present embodiment can consecutively perform all the processes from the formation of the undercoat film UF to the film deposition to fill the trench T with the film, which reduces the total process time and enhances the process efficiency.

Moreover, although the film deposition method in the present embodiment is described by citing an example of depositing the silicon nitride film, a metal nitride film such as TiN and AlN can be deposited by using a gas containing a metal and chlorine such as $TiCl_4$ and $AlCl_3$ as the source gas. With respect to a type of metal element, a variety of metal elements such as zirconium (Zr) and hafnium (Hf) can be selected other than Ti and Al. The film deposition to fill the trench T with the metal nitride can be performed by using the variety of metal elements and chlorine.

Thus, the film deposition method and film deposition apparatus according to the first embodiment can fill the trench T from the bottom surface with silicon nitride film or a metal nitride film, and can achieve high-quality filling deposition without generating a void.

Second Embodiment

Figure 10:
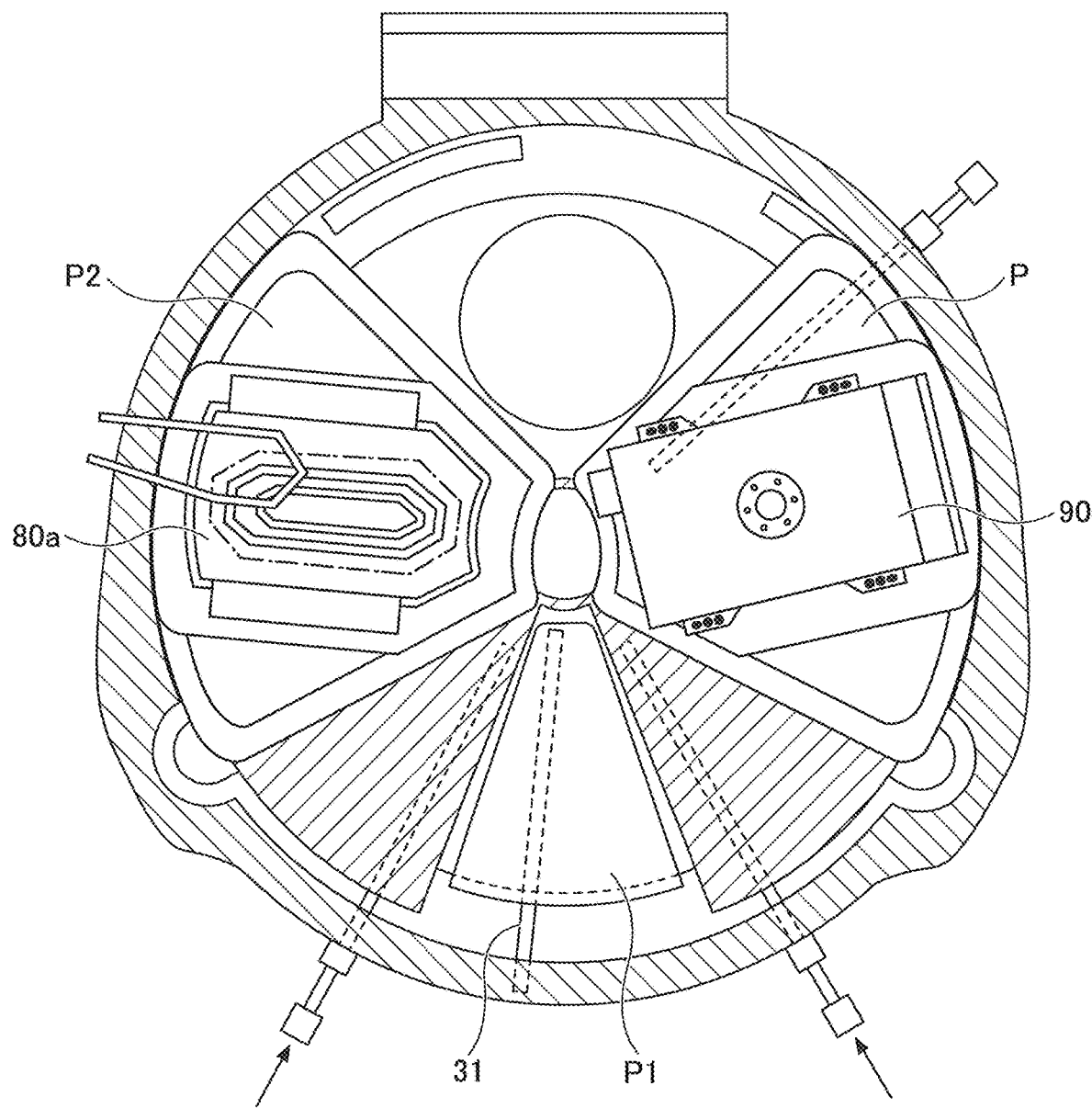
FIG. 10 is a schematic cross-sectional view illustrating an example of a film deposition apparatus according to an embodiment of the present disclosure.

FIG. 10 is a diagram illustrating an example of a film deposition apparatus according to a second embodiment of the present disclosure. The film deposition apparatus illustrated in FIG. 10 differs from the film deposition apparatus according to the first embodiment illustrated in FIGS. 1 through 8 in that a remote plasma generator 90 is provided at the third process region P3.

Chlorine gas intensely converted to plasma sometimes etches the undercoat film UF. The ICP (Inductively Coupled Plasma) generators 80 and 80a described with reference to FIGS. 6 through 8 using the antenna 85 are effective to generate plasma with high plasma intensity, but activating chlorine may be performed by using a plasma generator that generates less intense plasma. The remote plasma generator 90 is appropriate to generate less intense plasma than the plasma generators 80 and 80a. Hence, in the film deposition apparatus according to the second embodiment, an example in which the remote plasma generator 90 activates chlorine in the third process region P3 is described below.

Figure 11:
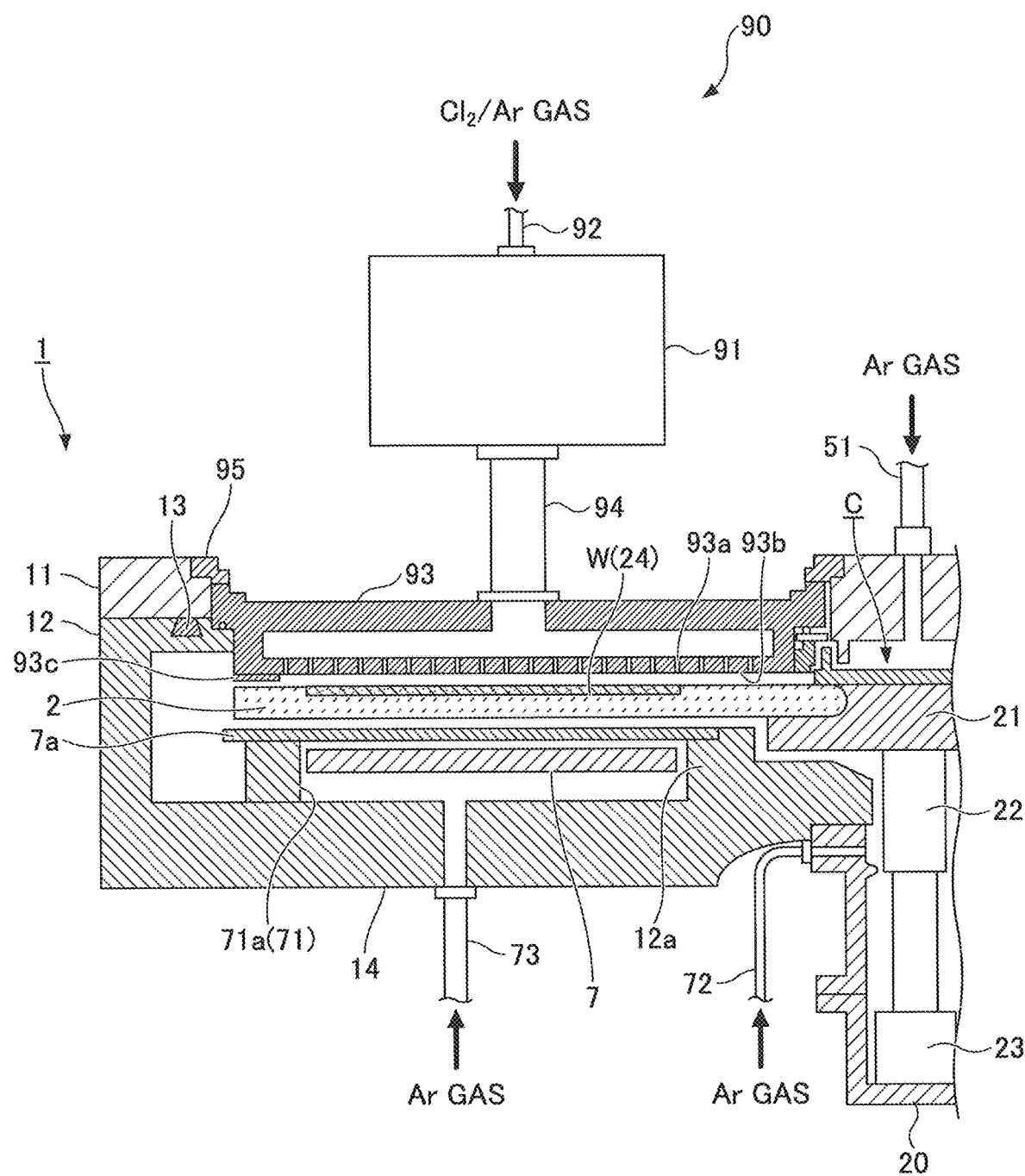
FIG. 11 is a partial cross-sectional view for illustrating a third process region of a film deposition apparatus according to an embodiment of the present disclosure.

FIG. 11 is a cross-sectional view of the film deposition apparatus including the remote plasma generator 90 according to the second embodiment.

As illustrated in FIG. 11, the remote plasma generator 90 is provided opposite to the turntable 2 at the third process region P3. The remote plasma generator 90 includes a plasma generation part 91, a gas supply pipe 92, a showerhead part 93, and a pipe 94. Note that the showerhead part 93 is an example of a chlorine gas discharging part. Hence, for example, a chlorine gas nozzle may be used instead of the showerhead part 93.

The plasma generation part 91 activates chlorine gas supplied from the gas supply pipe 92 using a plasma source. The plasma source is not particularly limited as long as it is capable of activating chlorine gas to generate chlorine radicals. For example, an inductively coupled plasma (ICP), a capacitively coupled plasma (CCP), or a surface wave plasma (SWP) may be used as the plasma source.

The gas supply pipe 92 has one end that is connected to the plasma generation part 91 to supply chlorine gas to the plasma generation unit 91. The other end of the gas supply pipe 92 is connected to the chlorine gas supply source 132 that stores chlorine gas via an on-off valve and a flow controller 122, for example.

The showerhead part 93 is connected to the plasma generation unit 91 via the pipe 94. The showerhead part 93 supplies chlorine gas that has been activated by the plasma generation part 91 into the vacuum chamber 1. The showerhead part 93 is fan-shaped in planar view and is pressed downward along the circumferential direction by a press member 95 that is formed along the outer edge of the fan shape. The press member 95 is fixed to the ceiling plate 11 by a bolt or the like (not illustrated), and in this way, the internal atmosphere of the vacuum chamber 1 may be maintained airtight. The distance between a bottom surface of the showerhead part 93 when it is secured to the ceiling plate 11 and a surface of the turntable 2 may be arranged to be about 0.5 mm to about 5 mm, for example.

A plurality of gas discharge holes 93a are arranged at the showerhead part 93. In view of the difference in speed on a rotational center side and an outer peripheral side of the turntable 2, fewer gas discharge holes 93a are arranged on the rotational center side of the showerhead part 93, and more gas discharge holes 93a are arranged on the outer peripheral side of the showerhead part 93. The total number of the gas discharge holes 93a may be several tens to several hundreds, for example. Also, the diameter of the plurality of gas discharge holes 93a may be about 0.5 mm to about 3 mm, for example. Activated chlorine gas supplied to the showerhead part 93 is supplied to the space between the turntable 2 and the showerhead part 93 via the gas discharge holes 93a.

Figure 12:
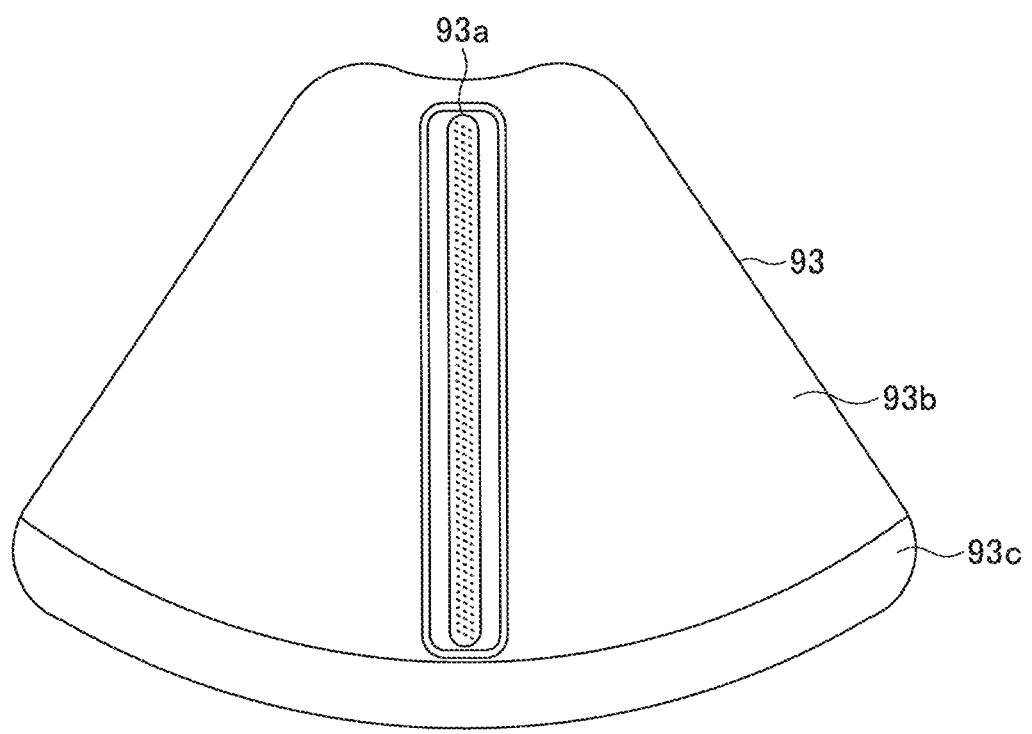
FIG. 12 is a plan view illustrating an example of a lower surface of a showerhead part.

FIG. 12 is a planar view illustrating an example of a lower surface of the showerhead part 93. As illustrated in FIG. 12, a downward protruding surface 93c may be provided in a belt-like form along the outer circumference of the lower surface 93b of the fan-shaped showerhead part 93. This can uniformly prevent the pressure on the outer peripheral side of the third process region P3 from decreasing in the circumferential direction. Moreover, the gas discharge holes 93a may be provided at the center of the lower surface 93b of the showerhead part 93 in the circumferential direction so as to extend in the radial direction. Thus, chlorine gas can be supplied in a dispersed manner from the central side throughout the outer peripheral side of the turntable 2.

Thus, activated chlorine gas may be supplied to the wafer W by using the remote plasma generator 90.

Here, because the film deposition method is the same as the film deposition method according to the first embodiment, the description is omitted.

WORKING EXAMPLES

Next, working examples of the film deposition method using the film deposition apparatus according to the second embodiment of the present disclosure is described below. In the working examples, the plasma generator 80a was provided at the second process region P2 while the remote plasma generator 90 was provided at the third process region, and a SiN film was deposited to fill a trench T.

An undercoat film UF was made a 10-nm thick SiN film. The temperature of a wafer W was set at 400° C., and the pressure in the vacuum chamber 1 was set at 0.75 Torr. The output of the radio frequency power source for the plasma generator 80a was set at 5 kW. The rotational speed of the turntable 2 was set at 10 rpm. DCS was used as the source gas, and the reaction gas nozzle 31 supplied a mixed gas of $DCS/N_2$ containing a carrier gas at flow rates of 1000/500 sccm, respectively. The second reaction gas nozzle 32 supplied a mixed gas of $Ar/NH_3$ at flow rates of 2000/2000 sccm, respectively. Moreover, the third reaction gas nozzle 33 supplied a mixed gas of $Ar/Cl_2$ at flow rates of 4000/X sccm, respectively, while changing the flow rate of $Cl_2$.

Figure 13:
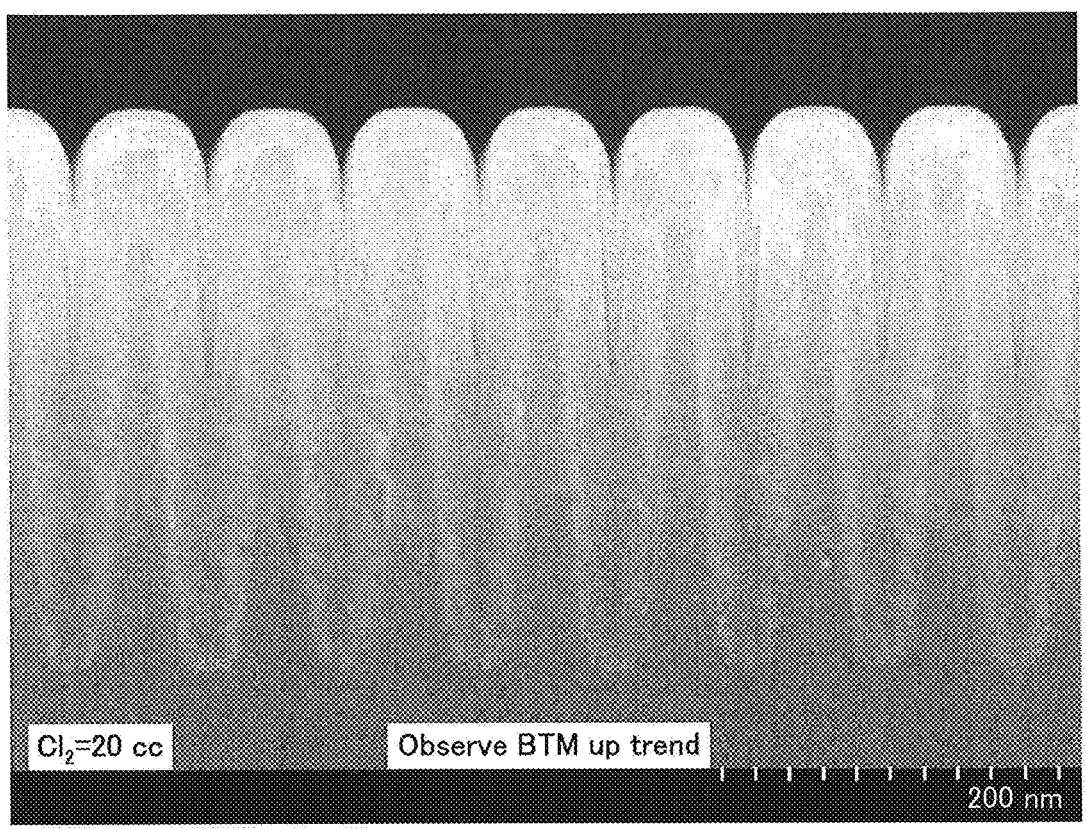
FIG. 13 shows a result of a film deposition method of a working example 1.

FIG. 13 shows a result of the film deposition method of a working example 1, and is a SEM (Scanning Electron Microscope) image showing a middle state of the bottom-up film deposition in which a flow rate of chlorine was set at 20 cc. FIG. 13 indicates that the bottom-up film deposition is performed while V-letter sections are formed in the trenches. The working example 1 has indicated that the film deposition according to the embodiment can achieve the bottom-up film deposition.

Figure 14:
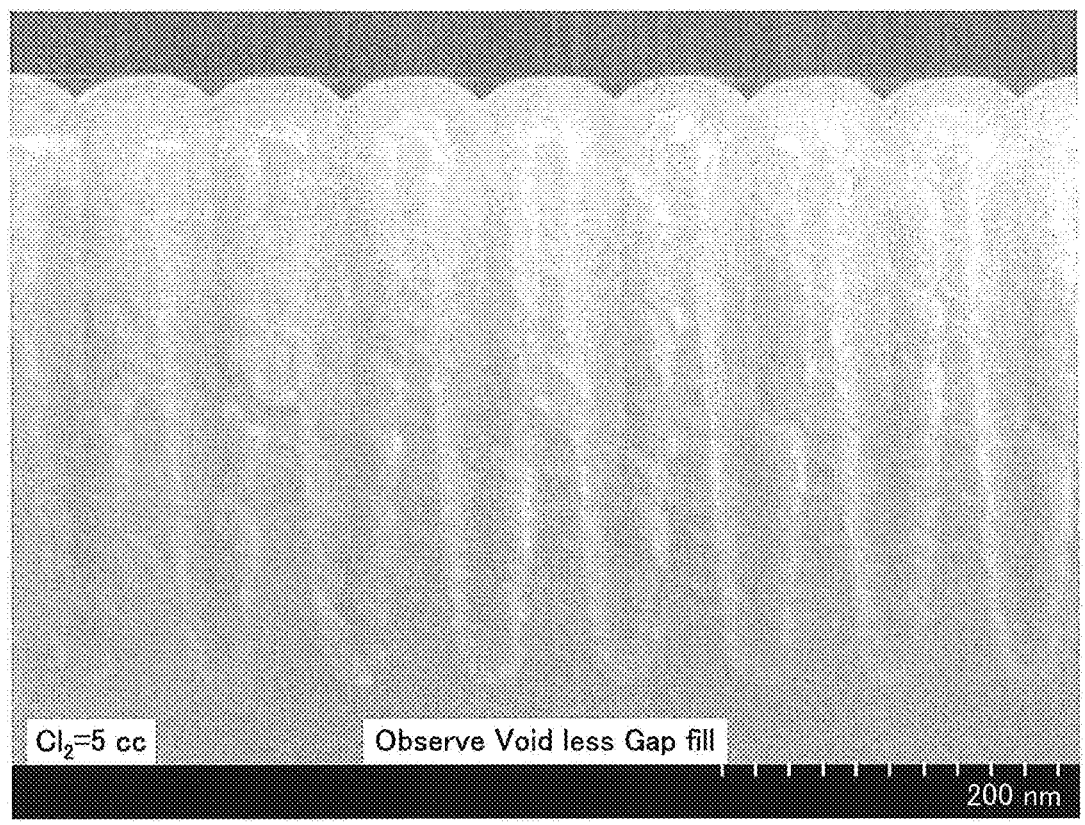
FIG. 14 shows a result of a film deposition method of a working example 2.

FIG. 14 shows a result of the film deposition method of a working example 2, and is a SEM image showing a finished state of the bottom-up film deposition in which a flow rate of chlorine was set at 5 cc. FIG. 14 indicates that filling deposition without a void is achieved. The working example 2 has indicated that the film deposition method according to the embodiment can implement the bottom-up film deposition.

Figure 15A:
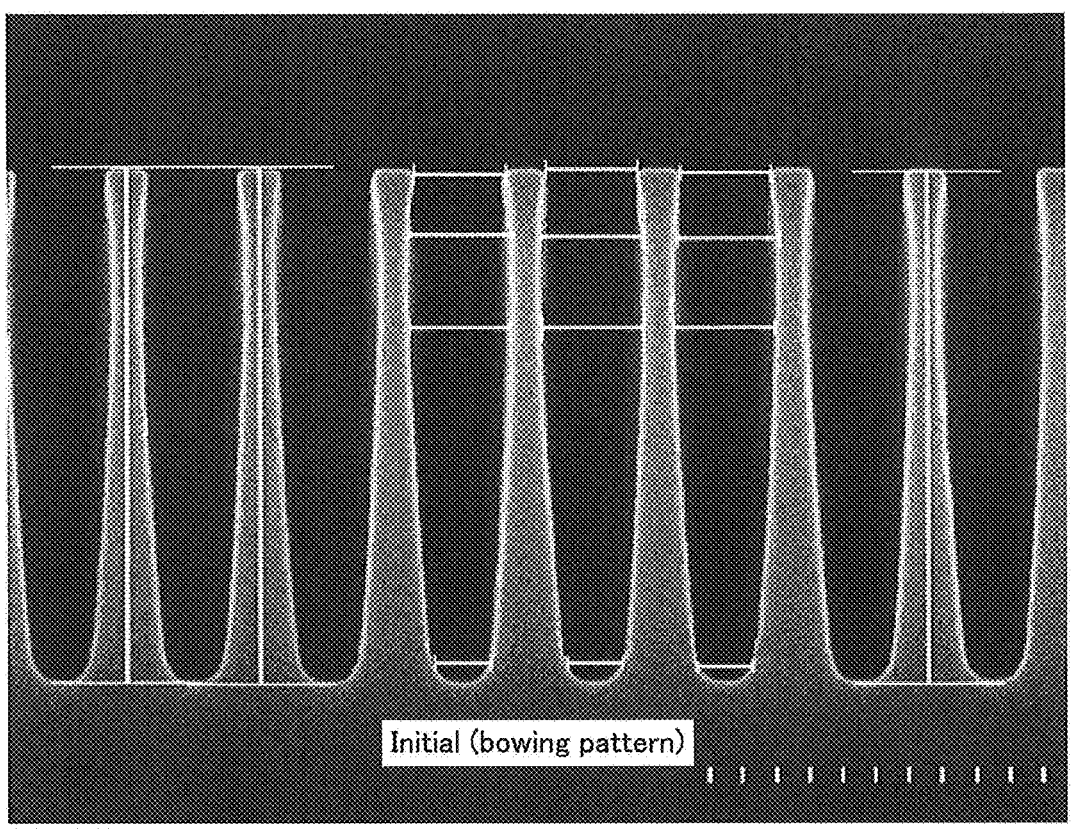
FIGS. 15A and 15B show a result of a conventional film deposition method of a comparative example.
Figure 15B:
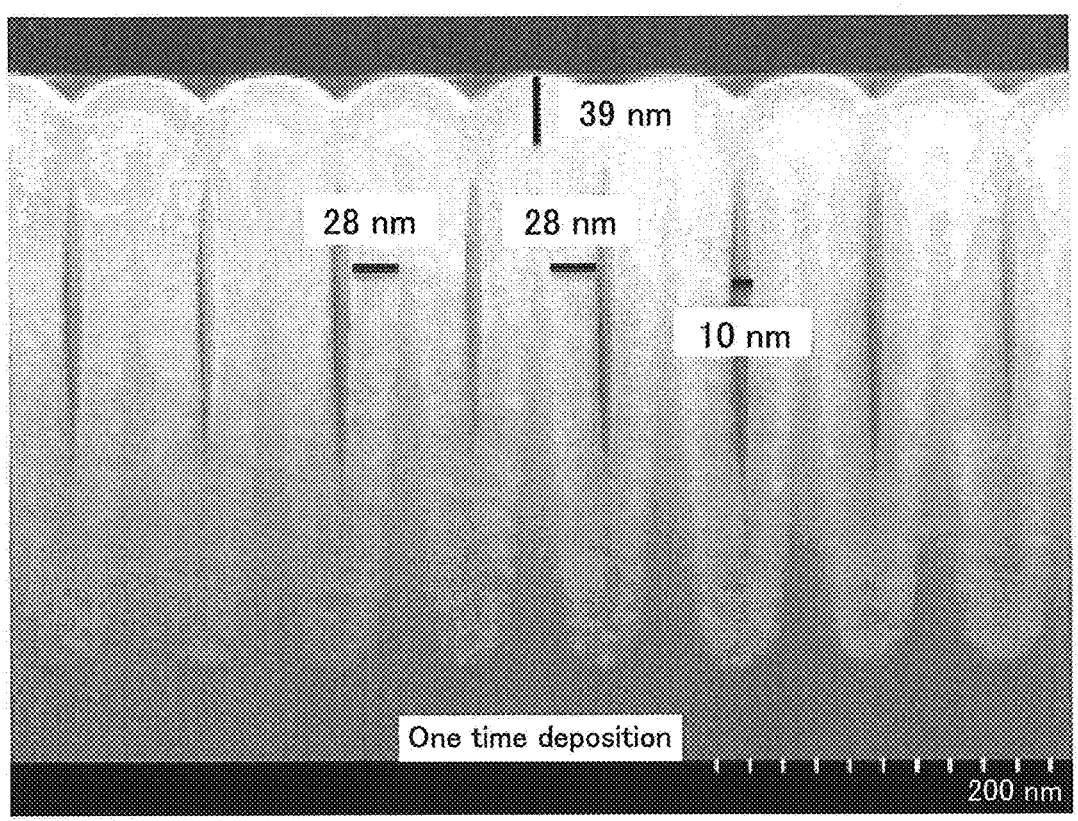

FIGS. 15A and 15B show results of a conventional film deposition method of a comparative example. FIG. 15A is a SEM image showing a state of trenches before depositing a film, and FIG. 15B is a SEM image showing a state of the filling deposition after integral trench filling deposition.

FIGS. 15A and 15B indicate that the conventional film deposition method generates voids. Compared to FIGS. 15A and 15B, FIGS. 13 and 14 indicate how superior the results of the working examples 1 and 2 show because the filling deposition does not generate any void.

FIGS. 16A through 18 show a result of the film deposition method of a working example 3. In the working example 3, a gap between the plasma generator 80a at the second process region P2 and the turntable 2 was set at 60 mm. Moreover, the thickness of the undercoat film UF was set at 2 nm. The temperature of the wafer W was set at 400° C., and the pressure in the vacuum chamber 1 was set at 0.75 Torr. The rotational speed of the turntable 2 was set at 5 rpm. Moreover, the output of the radio frequency power source for the plasma generator 80a at the second process region P2 was set at 5 kW. DCS was used as the source gas, and the first reaction gas nozzle 31 supplied a mixed gas of $DCS/N_2$ containing a carrier gas at flow rates of 1000/500 sccm, respectively. The second reaction gas nozzle 32 supplied a mixed gas of $Ar/NH_3$ at flow rates of 2000/2000 sccm, respectively. Furthermore, the reaction gas nozzle 33 supplied a mixed gas of $Ar/Cl_2$ at flow rates of 4000/5 sccm, respectively.

FIG. 16A through 16D are SEM images showing the change of a filling state of trenches over time. FIG. 16A is a SEM image showing a filling state of the trenches after a lapse of 5400 seconds from starting the trench filling deposition. FIG. 16B is a SEM image showing a filling state of the trenches after a lapse of 7200 seconds from starting the trench filling deposition. FIG. 16C is a SEM image showing a filling state of the trenches after a lapse of 9000 seconds from starting the trench filling deposition.

FIGS. 16A through 16C indicate that the filing deposition is achieved by gradually filling the trenches with the film from the bottom surface side while the cross section of the film is kept V-letter shapes.

FIG. 16D is an enlarged image of FIG. 16C. FIG. 16D indicates that the film filled in the trenches maintains the V-letter cross sections and widely opens the upper portions of the trenches. By performing such V-letter filling deposition, the recessed pattern can be filled with the nitride film without generating a void.

Figure 17:
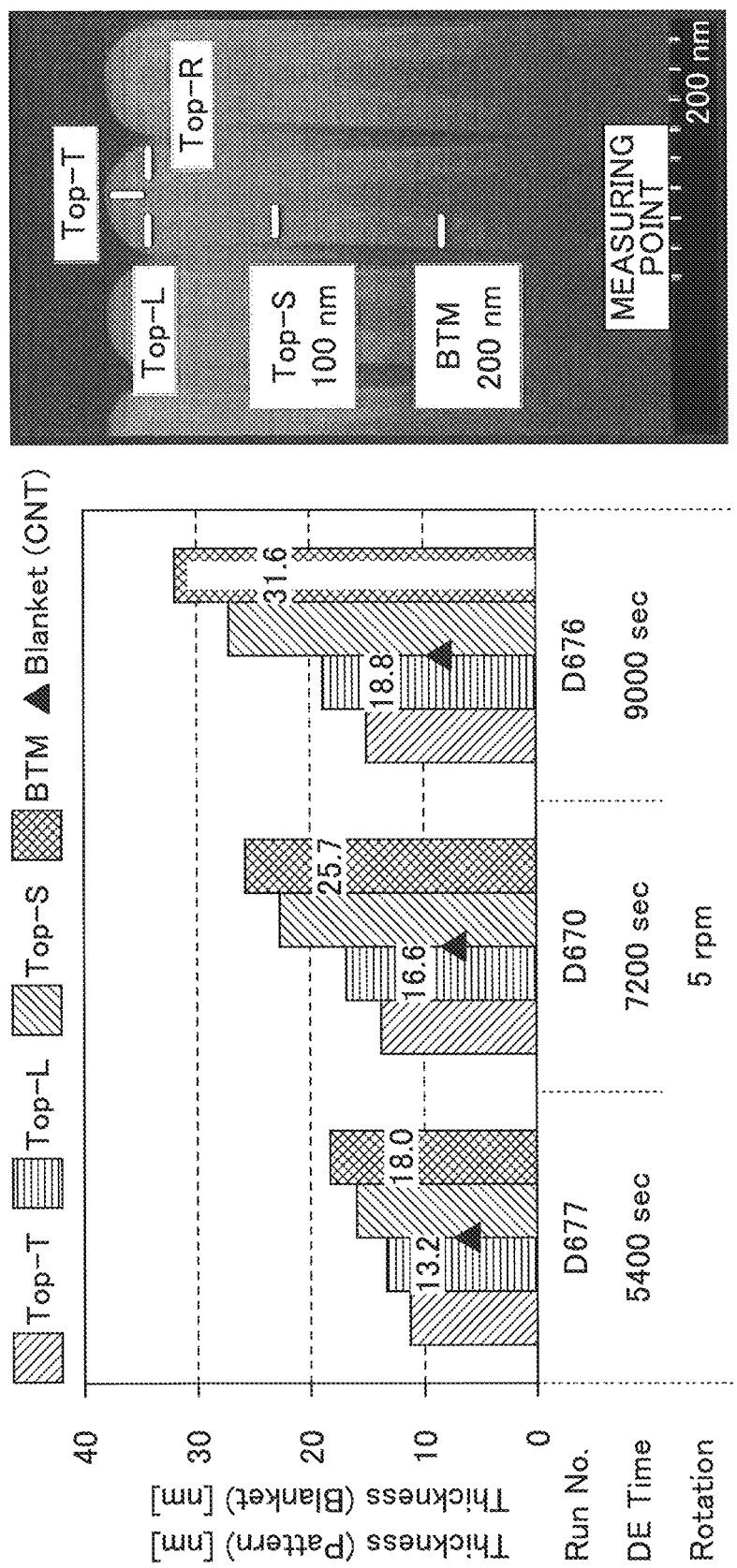
FIG. 17 shows measured results of measurement points set from a higher position to a lower position with respect to a film filled in a trench by film deposition to fill the trench in the working example 3.

FIG. 17 is a diagram showing measured results by setting measurement points of Top-T, Top-L, Top-S, and BTM from the top with respect to the film filled in the trenches by the trench filling deposition in the working example 3.

FIG. 17 indicates that the film thickness at Top-T less increases over time, but that the film thickness at BTM and Top-S significantly increases over time. Thus, the working example 3 has indicated that the film deposition method according to the embodiment can achieve the bottom-up film deposition (bottom-up filling).

Figure 18:
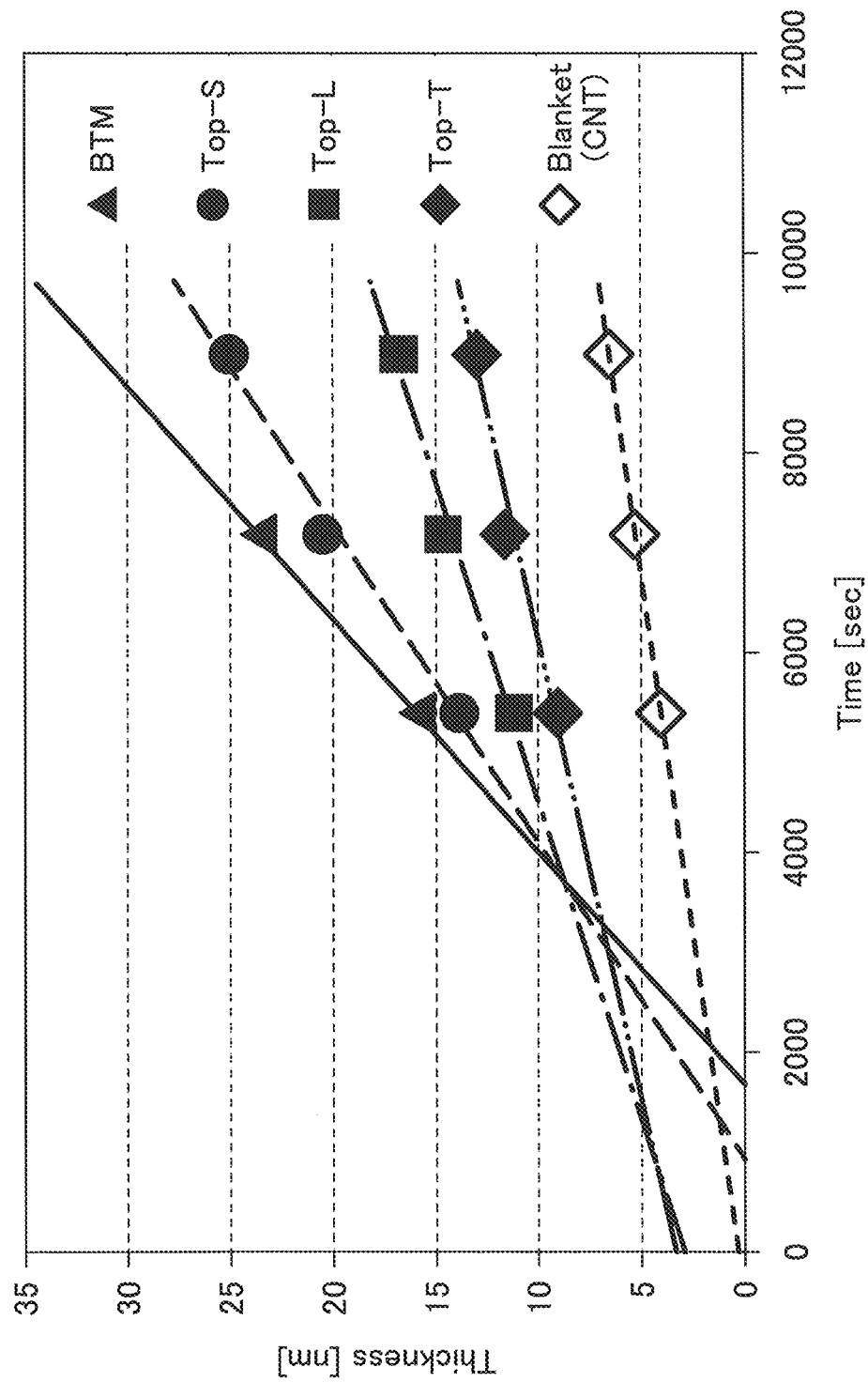
FIG. 18 shows an amount of film deposition at each measurement point in the working example 3.

FIG. 18 is a diagram showing an amount of film deposition at respective measurement points. FIG. 18 indicates that the amount of film deposition is high in the order of BTM, Top-S, Top-L, and Top-T, and the amount of film deposition increases with the decreasing distance from the bottom portion, which proves the achievement of the bottom-up film deposition.

Thus, the results of the working examples 1 through 3 have indicated that the film deposition method and film deposition apparatus according to the embodiments can achieve the filling deposition of the recessed pattern such as trenches and via holes with high bottom-up properties and the high-quality filling deposition without generating a void.

As discussed above, according to the embodiments of the present disclosure, filling deposition of a nitride film can be performed with high bottom-up properties.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:

1. A film deposition method for filling a recessed pattern formed in a surface of a substrate with a film from a bottom surface of the recessed pattern, the method comprising steps of:
   forming an adsorption blocking group by adsorbing chlorine gas activated by plasma on a top surface of the substrate and an upper portion of the recessed pattern, the chlorine gas being supplied to react with an H group, thereby producing HCl;
   adsorbing a source gas that contains chlorine and one of silicon and a metal on a lower portion of the recessed pattern where the adsorption blocking group is not formed, by supplying the source gas to the surface of the substrate including the recessed pattern; and
   depositing a molecular layer of a nitride film produced by a reaction of the source gas and a nitriding gas on the lower portion of the recessed pattern by supplying the nitriding gas to the surface of the substrate including the recessed pattern.

2. The film deposition method according to claim 1, wherein the steps of forming the adsorption blocking group, adsorbing the source gas, and depositing the molecular layer of the nitride film is made a cycle, and wherein the nitride film is filled in the recessed pattern by repeating the cycle predetermined number of times.

3. The film deposition method according to claim 2, wherein the substrate is arranged along a circumferential direction of a turntable, wherein a nitriding gas supply region, a chlorine gas supply region and a source gas supply region are arranged above the turntable and along a rotational direction of the turntable apart from each other, and wherein the steps of forming the adsorption blocking group, adsorbing the source gas, and depositing the molecular layer of the nitride film are sequentially repeated by rotating the turntable in the rotational direction, thereby filling the recessed pattern with the nitride film.

4. The film deposition method according to claim 3, wherein purge gas supply regions configured to supply a purge gas to the surface of the substrate are provided between the chlorine gas supply region and the source gas supply region, and between the source gas supply region and the nitriding gas supply region, respectively, and
further comprising:
supplying the purge gas between the steps of forming, the adsorption blocking group and adsorbing the source gas; and
supplying the purge gas between the steps of adsorbing the source gas and depositing the molecular layer of the nitride film.

5. The film deposition method according to claim 1, wherein the step of adsorbing the source gas comprises adsorbing the source gas that contains titanium or aluminum, and chlorine on the lower portion of the recessed pattern.

6. The film deposition method according to claim 1, wherein the substrate is made of silicon.

7. The film deposition method according to claim 6, wherein the substrate includes an undercoat film preliminarily formed on the surface including the recessed pattern.

8. The film deposition method according to claim 7, wherein the undercoat film is made of silicon nitride or silicon oxide.

9. The film deposition method according to claim 6, further comprising:
depositing an undercoat film on the surface of the substrate including the recessed pattern before the step of forming the adsorption blocking group.

10. The film deposition method according to claim 9, wherein the step of depositing the undercoat film comprises:
adsorbing a silicon-containing gas on the surface of the substrate including the recessed pattern by supplying the silicon-containing gas to the substrate, and depositing a molecular layer of a silicon nitride film produced by a reaction of the silicon-containing gas and a nitriding gas by supplying the nitriding gas to the surface of the substrate including the recessed pattern.

11. The film deposition method according to claim 10, wherein the source gas contains silicon and chlorine, and wherein the source gas containing silicon and chlorine is used as the silicon-containing gas.

12. The film deposition method according to claim 10, wherein the steps of adsorbing the silicon-containing gas and depositing the molecular layer of the silicon nitride film is periodically repeated predetermined number of times until the undercoat film reaches a predetermined thickness.

13. The film deposition method according to claim 1, wherein the step of depositing the molecular layer of the nitride film comprises supplying the nitriding gas while activating the nitriding gas by plasma.

* * * * *